United States Patent
Lee et al.

(10) Patent No.: US 11,390,805 B2
(45) Date of Patent: Jul. 19, 2022

(54) ETCHING COMPOSITION AND METHOD FOR MANUFACTURING SEMICONDUCTOR DEVICE USING THE SAME

(71) Applicant: SAMSUNG ELECTRONICS CO., LTD., Suwon-si (KR)

(72) Inventors: Jae Sung Lee, Seongnam-si (KR); Jung Hun Lim, Seongnam-si (KR); Mihyun Park, Seongnam-si (KR); Changsu Jeon, Hwaseong-si (KR); Jung-Min Oh, Incheon (KR); Subin Oh, Siheung-si (KR); Hyosan Lee, Hwaseong-si (KR)

(73) Assignees: SAMSUNG ELECTRONICS CO., LTD., Suwon-si (KR); Soulbrain Co., Ltd., Seongnam-si (KR)

(*) Notice: Subject to any disclaimer, the term of this patent is extended or adjusted under 35 U.S.C. 154(b) by 0 days.

(21) Appl. No.: 17/032,306

(22) Filed: Sep. 25, 2020

(65) Prior Publication Data

US 2021/0238478 A1    Aug. 5, 2021

(30) Foreign Application Priority Data

Feb. 5, 2020  (KR) .................. 10-2020-0013956

(51) Int. Cl.
  *C09K 13/06*  (2006.01)
  *H01L 21/28*  (2006.01)
  *H01L 21/3213*  (2006.01)

(52) U.S. Cl.
  CPC ........ *C09K 13/06* (2013.01); *H01L 21/28088* (2013.01); *H01L 21/32134* (2013.01); *H01L 21/32139* (2013.01)

(58) Field of Classification Search
  None
  See application file for complete search history.

(56) References Cited

U.S. PATENT DOCUMENTS

| | | | |
|---|---|---|---|
| 7,683,021 B2 | 3/2010 | Shea et al. | |
| 9,070,625 B2 | 6/2015 | Fitzsimmons et al. | |
| 9,831,088 B2 | 11/2017 | Chen et al. | |
| 10,332,784 B2 | 6/2019 | Casteel, Jr. et al. | |
| 10,377,948 B2 | 8/2019 | Lee et al. | |
| 2009/0212021 A1 | 8/2009 | Bernhard et al. | |
| 2011/0147341 A1* | 6/2011 | Sato | C23G 1/205 216/13 |
| 2011/0230053 A1* | 9/2011 | Matsuda | H01L 21/30604 438/745 |
| 2015/0104952 A1* | 4/2015 | Cui | C23F 1/18 438/745 |
| 2016/0257880 A1 | 9/2016 | Hong et al. | |
| 2017/0107460 A1* | 4/2017 | Liu | C11D 3/3947 |
| 2020/0024750 A1* | 1/2020 | Sasaki | H01L 21/308 |
| 2020/0035485 A1* | 1/2020 | Chen | C11D 3/046 |

FOREIGN PATENT DOCUMENTS

| | | |
|---|---|---|
| JP | 8-13166 A | 1/1996 |
| JP | 5037442 B2 | 7/2012 |
| KR | 10-1236133 B1 | 2/2013 |
| KR | 10-1587758 B1 | 1/2016 |
| KR | 10-2017-0084600 | 7/2017 |
| KR | 10-2017-0124705 A | 11/2017 |
| KR | 10-2018-0041936 A | 4/2018 |
| KR | 10-2018-0045185 | 5/2018 |

\* cited by examiner

*Primary Examiner* — Allan W. Olsen
(74) *Attorney, Agent, or Firm* — Lee IP Law, P.C.

(57) ABSTRACT

An etching composition and a method of manufacturing a semiconductor device, the composition including 5 wt % to 30 wt % of an oxidizing agent, based on a total weight of the etching composition; a salt including an anion including a carboxylate moiety having 1 to 5 carbon atoms, and an ammonium cation; and a chelating agent including a phosphonic acid having 1 to 8 carbon atoms.

20 Claims, 32 Drawing Sheets

ETCHING COMPOSITION AND METHOD FOR MANUFACTURING SEMICONDUCTOR DEVICE USING THE SAME

CROSS-REFERENCE TO RELATED APPLICATION

Korean Patent Application No. 10-2020-0013956, filed on Feb. 5, 2020, in the Korean Intellectual Property Office, and entitled: "Etching Composition and Method for Manufacturing Semiconductor Device Using the Same," is incorporated by reference herein in its entirety.

BACKGROUND

1. Field

Embodiments relate to an etching composition and a method for manufacturing a semiconductor device using the same.

2. Description of the Related Art

Semiconductor devices may be highly integrated and reliable in order to satisfy consumers' demand for excellent performance and an affordable price.

SUMMARY

The embodiments may be realized by providing an etching composition including 5 wt % to 30 wt % of an oxidizing agent, based on a total weight of the etching composition; a salt including an anion including a carboxylate moiety having 1 to 5 carbon atoms, and an ammonium cation; and a chelating agent including a phosphonic acid having 1 to 8 carbon atoms.

The embodiments may be realized by providing an etching composition including 5 wt % to 30 wt % of an oxidizing agent; 1 wt % to 15 wt % of a pH adjusting agent containing an ammonium salt; and 0.1 wt % to 5 wt % of a chelating agent, all wt % being based on a total weight of the etching composition, wherein the etching composition has a pH of 4.0 to 5.8.

The embodiments may be realized by providing a method of manufacturing a semiconductor device, the method including preparing a substrate that includes a metal-containing film thereon; and performing an etching process using the etching composition according to an embodiment on the metal-containing film to remove the metal-containing film.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
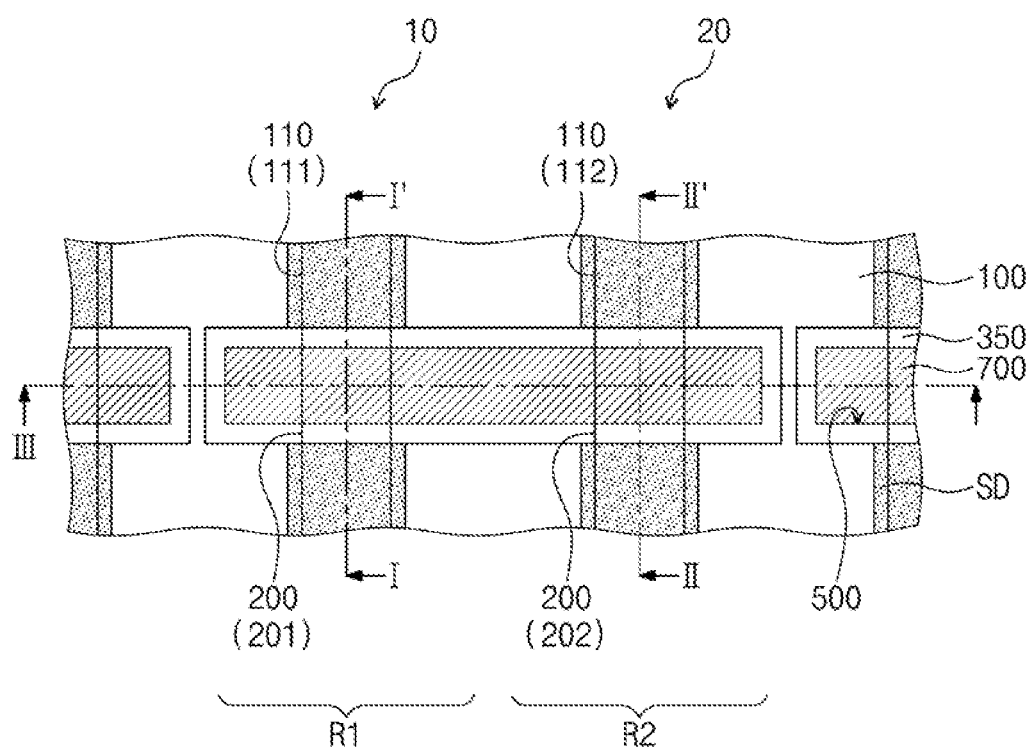
FIG. 1 is a plan view of a semiconductor device according to embodiments.

In the present description, an alkyl group may be a linear alkyl group, a branched alkyl group, or a cyclic alkyl group. In an implementation, the number of carbon atoms in the alkyl group may be a suitable number, e.g., 1 to 8.

In an implementation, the number of carbon atoms in carboxylate may be a suitable number, e.g., 1 to 5. In an implementation, carboxylate may include formate ($HCOO^-$) and alkyl carboxylate. Alkyl carboxylate may include substituted or unsubstituted alkyl carboxylate having 2 to 5 carbon atoms.

In an implementation, the number of carbon atoms in phosphonic acid may be a suitable number, e.g., 1 to 8. In an implementation, the phosphonic acid may include an aliphatic phosphonic acid having 1 to 8 carbon atoms or cyclic phosphonic acid having 5 to 8 carbon atoms. Aliphatic phosphonic acid may include substituted or unsubstituted alkyl phosphonic acid. Cyclic phosphonic acid may include substituted or unsubstituted aromatic cyclic phosphonic acid. Phosphonic acid derivatives may include a conjugate base of phosphonic acid.

Hereinafter, an etching composition according to an embodiment will be described.

In an implementation, an etching composition may include, e.g., an oxidizing agent, a pH adjusting agent, and a chelating agent. The etching composition may be used for etching a metal-containing film. In an implementation, an etching target film may include a metal-containing film. The metal-containing film may include titanium, lanthanum (La), aluminum, or hafnium. The metal-containing film may include, e.g., a titanium nitride film. In an implementation, the titanium nitride film may further include lanthanum, aluminum, or hafnium. In an implementation, the metal-containing film may be a metal oxide film, and the metal oxide film may include lanthanum, aluminum, or hafnium. In an implementation, the metal-containing film may include the titanium nitride film and the metal oxide film described above. Hereinafter, in order to simplify description, the case in which an etching target film is a titanium nitride film including lanthanum or aluminum is exemplarily described, but the etching target film of the etching composition may be a suitable etching target film. In the present description, etching a film may indicate that a material constituting the film is removed. As used herein, the term "or" is not an exclusive term, e.g., "A or B" would include A, B, or A and B.

In an implementation, the oxidizing agent may include, e.g., hydrogen peroxide, nitric acid, or ammonium sulfate. The oxidizing agent may etch a metal-containing film such as a titanium nitride film. Depending on the content ratio or amount of the oxidizing agent included in the composition, the etching rate of the metal-containing film may be controlled. In an implementation, when the amount of the oxidizing agent increases, the etching rate of the titanium nitride film may increase. Maintaining the amount of the oxidizing agent the etching composition at 5 wt % or greater may help ensure that the etching rate of the titanium nitride film is sufficient. Maintaining the amount of the oxidizing agent the etching composition at 30 wt % or less may help prevent undesired further etching of another film, e.g., may help prevent undesired etching of a mask film or an organic film. In an implementation, the oxidizing agent may be included in the composition in an amount of about 5 wt % to about 30 wt %, based on a total weight of the composition. In an implementation, in the etching process using the etching composition according to embodiments, the etch selectivity of the titanium nitride film may be improved.

In an implementation, the pH adjusting agent may include a salt. In an implementation, the salt may be an ammonium salt. The pH adjusting agent may include a cation and an anion. In an implementation, the cation may be an ammonium cation. In an implementation, the anion may include a carboxylate moiety having 1 to 5 carbon atoms. In an implementation, the pH adjusting agent may include a carboxylate moiety having 1 to 5 carbon atoms (as an anion) and may include an ammonium ion (as a cation). In an implementation, the pH adjusting agent may include, e.g., ammonium acetate.

In an implementation, the pH adjusting agent may include an ammonium phosphate, e.g., ammonium phosphate monobasic, ammonium phosphate dibasic, or ammonium triphosphate. Ammonium phosphate monobasic may be represented as $(NH_4^+)(H_2PO_4^-)$, ammonium phosphate dibasic may be represented as $(NH_4^+)_2(HPO_4^{-2})$, and ammonium triphosphate may be represented as $(NH_4^+)_3(HPO_4^{-3})$. In an implementation, the pH adjusting agent may include an ammonium halide, e.g., ammonium chloride ($NH_4Cl$) or ammonium iodide ($NH_4I$). In an implementation, the pH adjusting agent may include an ammonium carbonate or an ammonium nitrate.

In the etching process using the etching composition, the anion of the pH adjusting agent may etch titanium, lanthanum, aluminum, or hafnium. Depending on the type of the anion of the pH adjusting agent, the type of metal to be etched may be determined. In an implementation, when the etching target film is a titanium nitride film that contains lanthanum or aluminum, a pH adjusting agent including a carboxylate moiety having 1 to 5 carbon atoms and an ammonium ion may be used. The pH adjusting agent may include a carboxylate moiety having 1 to 5 carbon atoms and an ammonium ion to remove lanthanum or aluminum.

Maintaining the amount of the pH adjusting agent in the etching composition at 1 wt % or greater may help ensure that the etching rate of the metal-containing film is not too small. Maintaining the amount of the pH adjusting agent in the etching composition at 15 wt % or less may help prevent undesired further etching of another film, e.g., may help prevent undesired etching of a mask film or an organic film. The organic film may be a resist pattern which will be described below, and the mask film may include a bottom anti-reflective coating (BARC) material. In an implementation, the pH adjusting agent may be included in the composition in an amount of about 1 wt % to about 15 wt %, based on the total weight of the compositon. Accordingly, the etching process using the etching composition may exhibit a high etching rate and improved etch selectivity with respect to a metal-containing film.

In an implementation, the chelating agent may include a phosphonic acid having 1 to 8 carbon atoms or derivatives thereof. The phosphonic acid derivative may include a conjugate base of phosphonic acid. The phosphonic acid may include a phosphonic acid functional group and a hydrocarbon having 1 to 8 carbon atoms, and phosphorus (P) of the phosphonic acid functional group may be bonded to the hydrocarbon. In an implementation, the chelating agent may include two or more phosphonic acid functional groups, and each of the phosphonic acid functional groups may be attached to the hydrocarbon group. In an implementation, the chelating agent may include phenylphosphonic acid, ethylenediaminetetraphosphonic acid, nitrilotris(methylene) tris-phosphonic acid, 1-hydroxyethane-1,1-diphosphonic acid, or derivatives thereof. Nitrilotris(methylene) tris-phosphonic acid and derivatives thereof may include a material of Compound Group 1 below. 1-hydroxyethane-1,1-diphosphonic acid and derivatives thereof may include a material of Compound Group 2 below. Ethylenediaminetetra phosphonic acid may include a material of Compound Group 3 below.

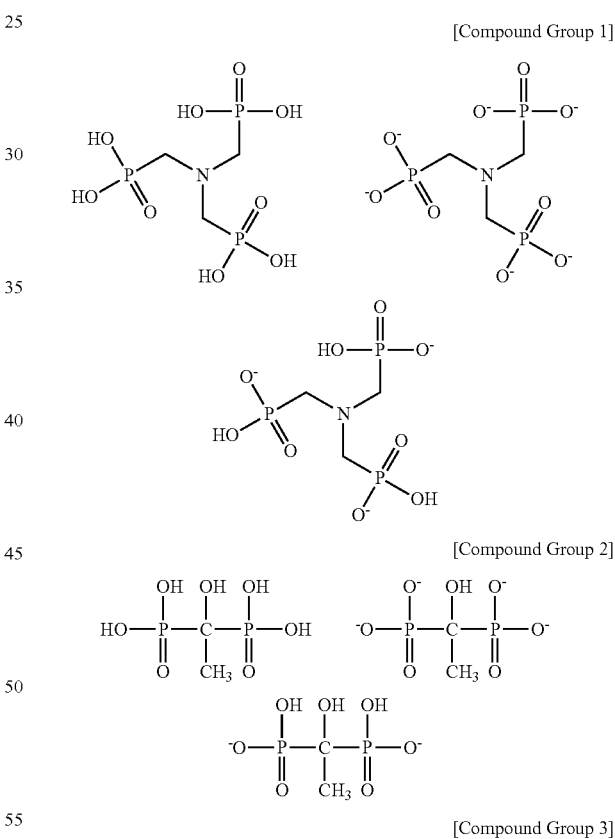

[Compound Group 1]

[Compound Group 2]

[Compound Group 3]

-continued

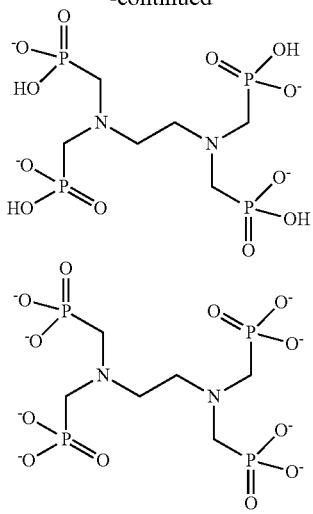

The chelating agent may have two or more acetic acid functional groups. In an implementation, the chelating agent may include ethylenediaminetetraacetic acid, iminodiacetic acid, or diethylenetriaminepentaacetic acid. In an implementation, the chelating agent may include glycine, alanine, valine, leucine, tyrosine, sulfamic acid, or cysteine.

The chelating agent may help remove lanthanum, aluminum, or hafnium. Depending on the type of a chelating agent, the type of metal to be removed in an etching process may be determined. In an implementation, in the etching process of a titanium nitride film containing lanthanum or aluminum, phosphonic acid or derivatives thereof may be used as a chelating agent. The phosphonic acid or derivatives thereof may interact with lanthanum and aluminum to remove lanthanum and aluminum.

Maintaining the amount of the chelating agent in the etching composition in an amount at 0.1 wt % or greater may help ensure that the etching rate of lanthanum or aluminum is not too small. Maintaining the amount of the chelating agent in the etching composition in an amount at 5 wt % or less may help ensure that the pH of the etching composition is 4.0 to 5.8. In an implementation, the chelating agent may be included in the composition in an amount of, e.g., about 0.1 wt % to about 5 wt %. Accordingly, the etching target film may be well etched.

In an implementation, the etching composition may have a pH of 4.0 to 5.8. The pH of the etching composition may be controlled by the pH adjusting agent and the chelating agent. In an implementation, the pH adjusting agent may be included in an amount of 1 wt % to 15 wt %, and the chelating agent may be included in an amount of 0.1 wt % to 5 wt %, and the pH of the etching composition may be 4.0 to 5.8. Maintaining the pH of the etching composition at 4.0 or greater may help ensure that the etching rate of a metal-containing film is not too small. In an implementation, the pH of the etching composition may be 4.0 or more, and the etching rate of a metal-containing film may be improved. Maintaining the pH of the etching composition at 5.8 or less may help prevent the oxidizing agent from decomposing in the etching process. In an implementation, the pH of the etching composition may be 5.8 or less, and decomposition of the oxidizing agent in the etching process may be prevented.

The etching composition may further include a solvent. In an implementation, the solvent may include water. In an implementation, the solvent may be included in a balance amount of the composition. In an implementation, the solvent may be included in the etching composition in an amount of, e.g., 50 wt % to about 93.9 wt %.

Hereinafter, a method for manufacturing a semiconductor device according to an embodiment will be described.

FIG. 1 is a plan view of a semiconductor device according to embodiments. FIGS. 2A, 3A, 4A, 5A, 6A, 7A, 8A, 9A, 10A, 11A, 12A, and 13A are views of stages in a method for manufacturing a semiconductor device according to embodiments, and correspond to cross-sections taken along lines I-I' and II-II' of FIG. 1. FIGS. 2B, 3B, 4B, 5B, 6B, 7B, 8B, 9B, 10B, 11B, 12B, and 13B are views of stages in a method for manufacturing a semiconductor device according to embodiments, and correspond to cross-sections taken along a line III-IV of FIG. 1. FIG. 7C is an enlarged view of a region V of FIG. 7B. FIG. 8C is an enlarged view of a region V of FIG. 8B. FIG. 9C is an enlarged view of a region V of FIG. 9B. FIG. 9D is a view for explaining results of an etching process using an etching composition according to another example, and corresponds to an enlarged view of a region V of FIG. 9B. FIG. 10C is an enlarged view of a region V of FIG. 10B. FIG. 11C is an enlarged view of a region V of FIG. 11B. FIG. 12C is an enlarged view of a region V of FIG. 12B. FIG. 13C is an enlarged view of a region V of FIG. 13B. Hereinafter, duplicated descriptions as described above may be omitted.

Figure 2A:
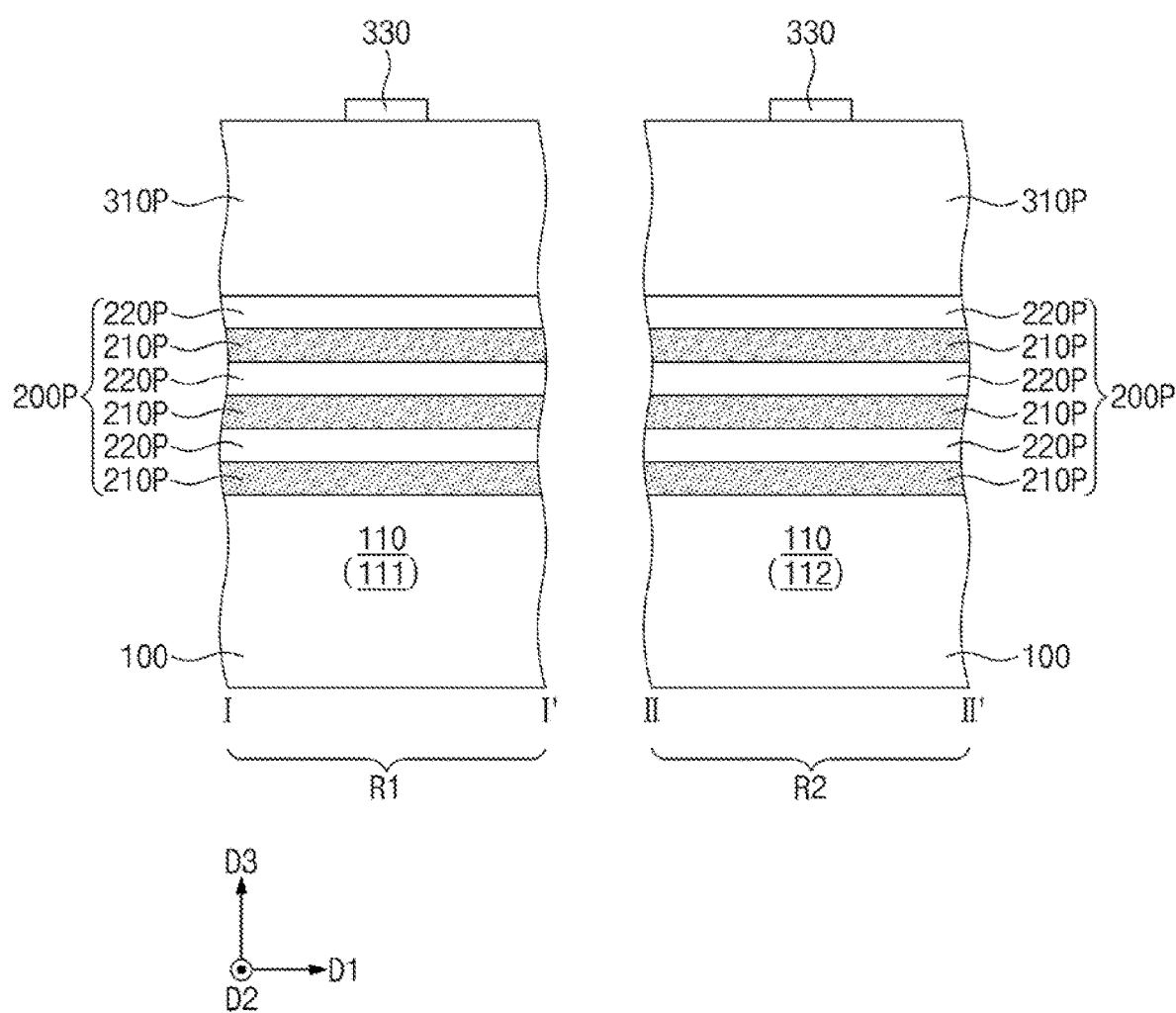
FIGS. 2A, 3A, 4A, 5A, 6A, 7A, 8A, 9A, 10A, 11A, 12A, and 13A are views of stages in a method for manufacturing a semiconductor device according to embodiments, and correspond to cross-sections taken along lines I-I' and II-II' of FIG. 1.
Figure 2B:
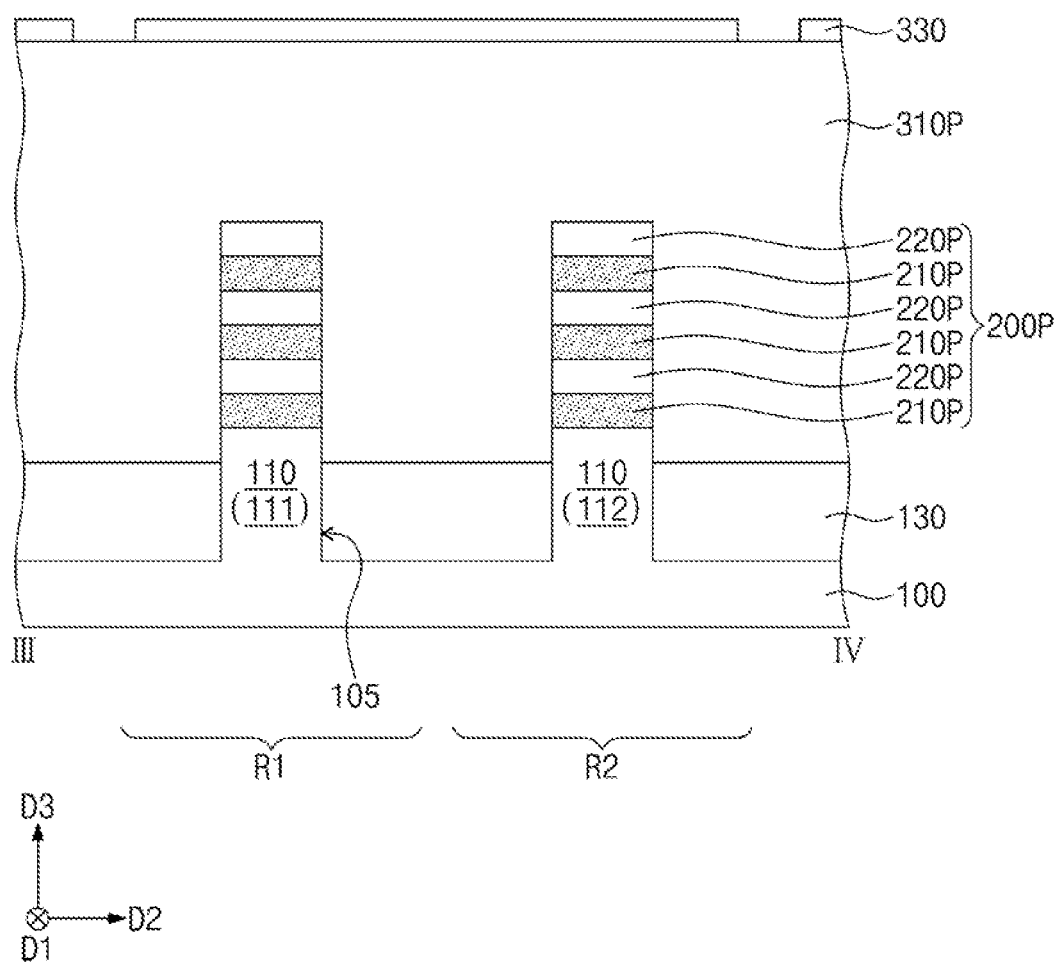
FIGS. 2B, 3B, 4B, 5B, 6B, 7B, 8B, 9B, 10B, 11B, 12B, and 13B are views of stages in a method for manufacturing a semiconductor device according to embodiments, and correspond to cross-sections taken along a line III-IV of FIG. 1.

Referring to FIGS. 1, 2A, and 2B, a substrate 100 having a first region R1 and a second region R2 may be prepared. The substrate 100 may be a semiconductor substrate. In an implementation, the substrate 100 may be a silicon substrate or a silicon on insulator (SOI) substrate. The second region R2 of the substrate 100 may be spaced apart from the first region R1 in a plan view (e.g., in a second direction D2).

Preliminary active patterns 200P and base active patterns 110 may be formed on the substrate 100. The forming of the preliminary active patterns 200P and the base active patterns 110 may include stacking a plurality of semiconductor layers on the substrate 100, and patterning the semiconductor layers and an upper portion of the substrate 100 to form trenches 105. The trenches 105 may define the preliminary active patterns 200P and the base active patterns 110. The trenches 105 may have a line shape extending in a first direction D1, and may be spaced apart from each other in the second direction D2. The first direction D1 may be parallel to a bottom surface of the substrate 100. The second direction D2 may be parallel to a bottom surface of the substrate 100 and may be substantially perpendicular to the first direction D1.

The base active patterns 110 may be formed by patterning an upper portion of the substrate 100. The base active patterns 110 may have a line shape extending in the first direction D1. The base active patterns 110 may include a first base active pattern 111 and a second base active pattern 112. The first base active pattern 111 may overlap the first region R1 of the substrate 100 in a plan view, and the second base active pattern 112 may overlap the second region R2 of the substrate 100. The second base active pattern 112 may be spaced apart from the first base active pattern 111 in the second direction D2 or in a direction opposite to the second direction D2.

The preliminary active patterns 200P may be formed on upper surfaces of the base active patterns 110, respectively. The preliminary active patterns 200P may be spaced apart from each other in the second direction D2 or in a direction opposite to the second direction D2. Each of the preliminary active patterns 200P may include first preliminary semiconductor patterns 210P and second preliminary semiconductor patterns 220P. The first preliminary semiconductor patterns 210P and the second preliminary semiconductor patterns 220P may be alternately and repeatedly stacked along a third direction D3. The third direction D3 may be substantially perpendicular to the first direction D1 and the second direction D2. Each of the first preliminary semiconductor patterns 210P and the second preliminary semiconductor patterns 220P may have a line shape extending in the first direction D1.

Each of the first preliminary semiconductor patterns 210P may include a first semiconductor material. The first semiconductor material may include, e.g., germanium. Each of the first preliminary semiconductor patterns 210P may further include a second semiconductor material. The second semiconductor material may include, e.g., silicon. In an implementation, each of the first preliminary semiconductor patterns 210P may include germanium or silicon-germanium. The first preliminary semiconductor patterns 210P may serve as sacrificial films. Each of the second preliminary semiconductor patterns 220P may include the second semiconductor material. In an implementation, the second preliminary semiconductor patterns 220P may be a silicon film such as a polysilicon film. The first preliminary semiconductor patterns 210P and the second preliminary semiconductor patterns 220P may be formed by an epitaxial growth process using the substrate 100 as a seed and an etching process. The number of the first preliminary semiconductor patterns 210P and the second preliminary semiconductor patterns 220P may be variously changed.

Device isolation patterns 130 may be formed on the substrate 100 to fill the trenches 105, respectively. The device isolation patterns 130 may be formed on the substrate 100 on both sides of each base active pattern 110. The device isolation patterns 130 may extend in the first direction D1. Upper surfaces of the device isolation patterns 130 may be at a lower level than upper surface of each base active pattern 110. The device isolation patterns 130 may include a silicon-based insulating material. The device isolation patterns 130 may include, e.g., silicon oxide.

A preliminary sacrificial gate 310P may be formed on the preliminary active patterns 200P and the device isolation patterns 130. The preliminary sacrificial gate 310P may cover upper sidewalls and upper surfaces of the preliminary active patterns 200P and the upper surfaces of the device isolation patterns 130. The preliminary sacrificial gate 310P may include a second semiconductor material. The preliminary sacrificial gate 310P may have a crystalline structure. In an implementation, the preliminary sacrificial gate 310P may include polysilicon.

A mask pattern 330 may be formed on the preliminary sacrificial gate 310P. The mask pattern 330 may include, e.g., silicon nitride, silicon carbonitride, or silicon oxynitride.

Figure 3A:
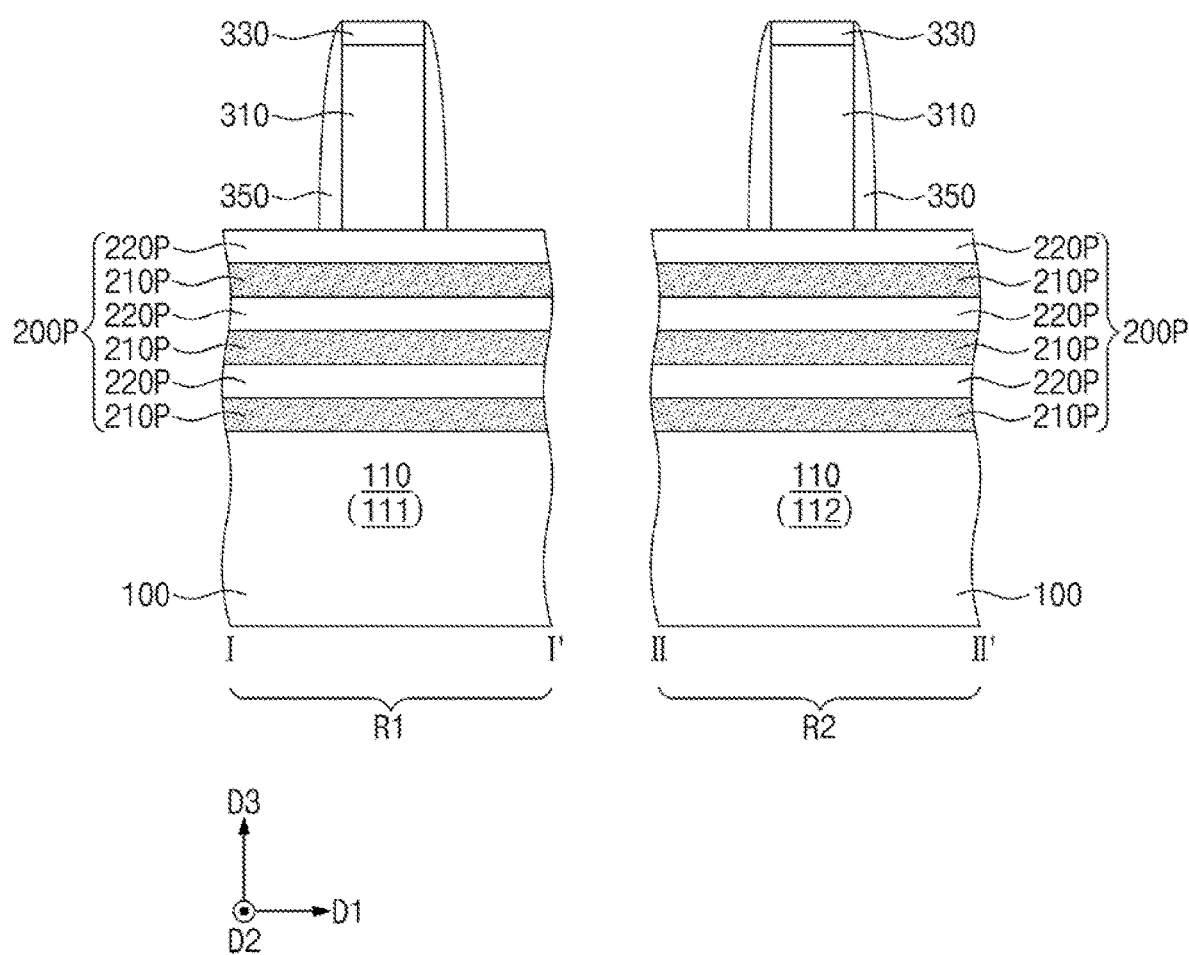
Figure 3B:
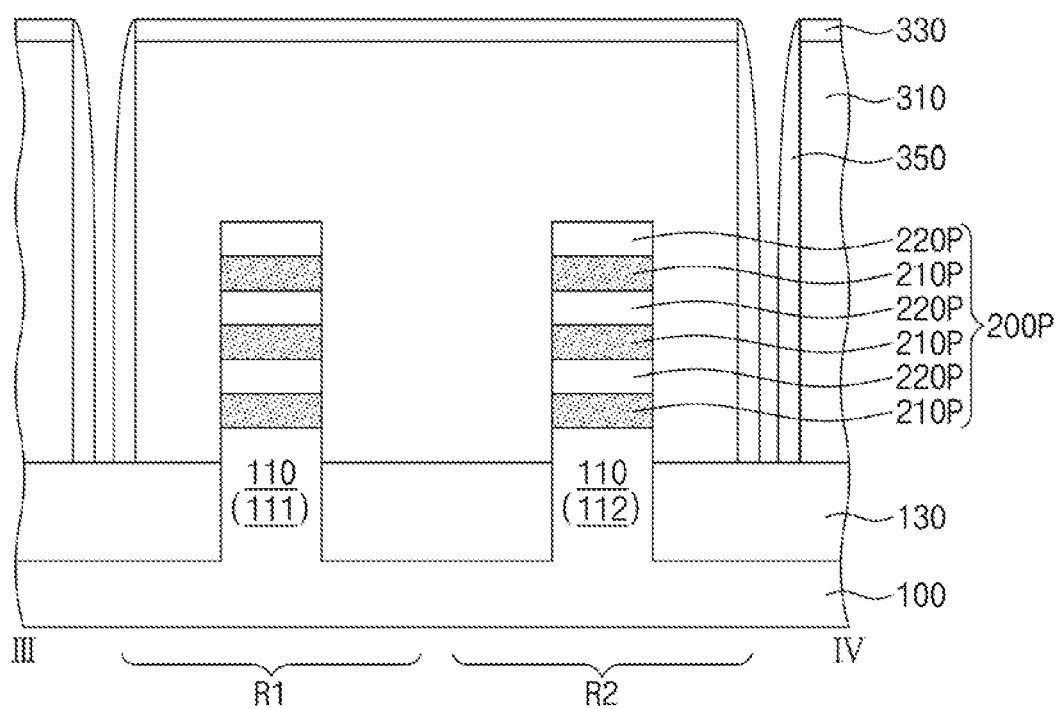
Figure 3B:
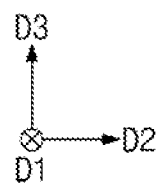

Referring to FIGS. 1, 3A, and 3B, the preliminary sacrificial gate 310P may be patterned by an etching process to form a sacrificial gate pattern 310. In the etching process, a mask pattern 330 may be used as an etching mask. Sidewalls of the mask pattern 330 may be vertically aligned with sidewalls of the sacrificial gate pattern 310. The sacrificial gate pattern 310 may extend in a direction parallel to the second direction D2 on the substrate 100, and may traverse the preliminary active patterns 200P, the base active pattern 110, and device isolation patterns 130 as shown in FIG. 4B. In an implementation, an etch stop pattern may be further formed between the sacrificial gate pattern 310 and the preliminary active patterns 200P, and between the sacrificial gate pattern 310 and the device isolation patterns 130.

A spacer pattern 350 may be formed on both sides of the sacrificial gate pattern 310 to cover sidewalls of the sacrificial gate pattern 310. The spacer pattern 350 may expose the preliminary active patterns 200P and some device isolation patterns 130. The spacer pattern 350 may include, e.g., silicon nitride, silicon carbonitride, or silicon oxynitride.

Figure 4A:
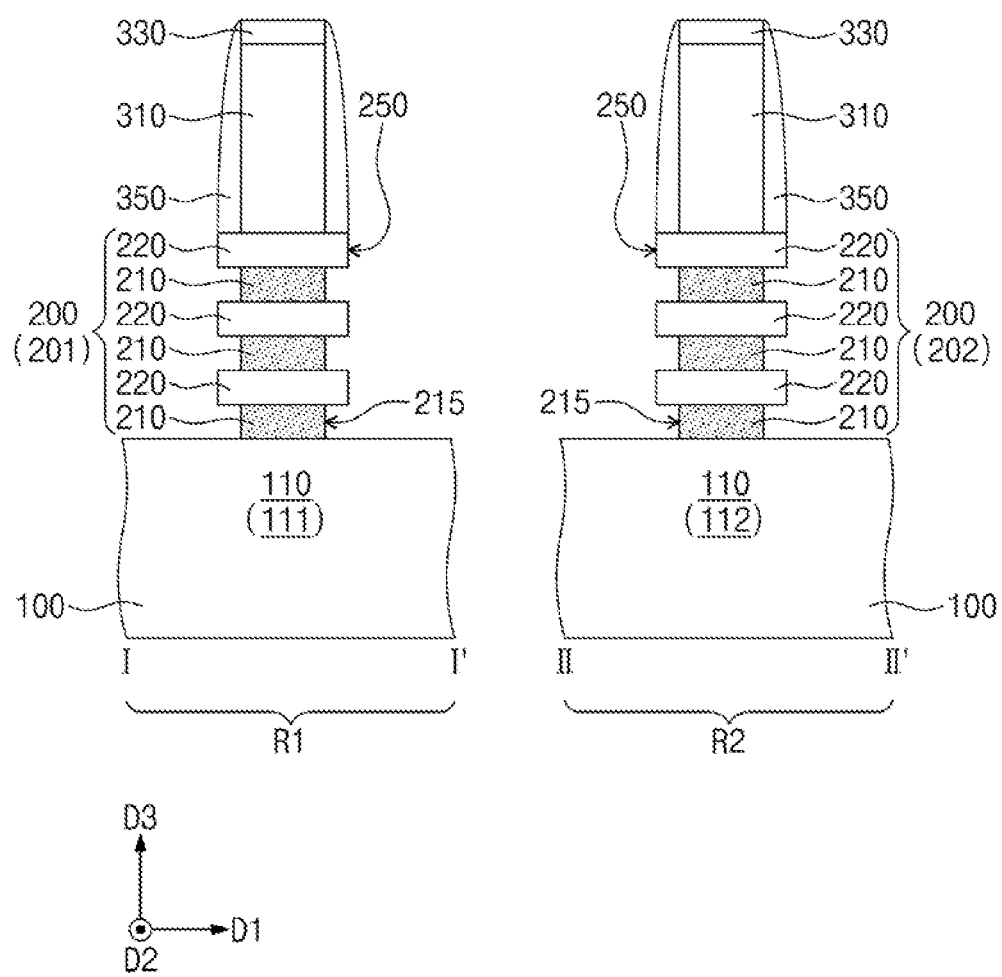
Figure 4B:
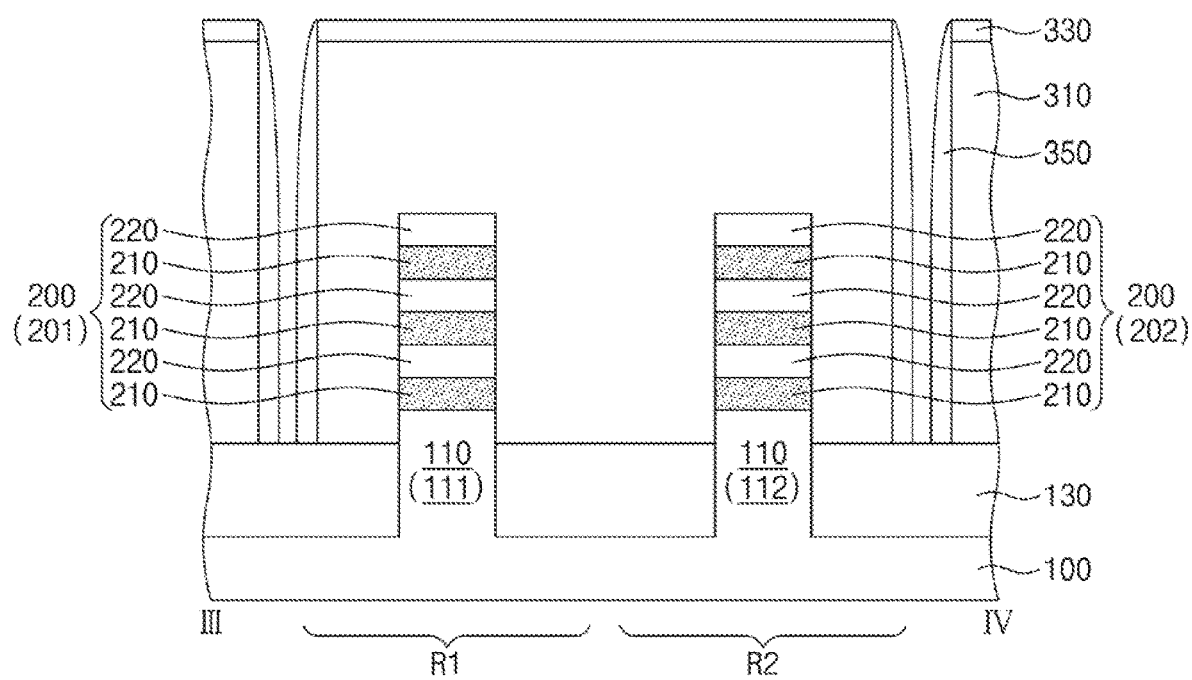

Referring to FIGS. 1, 4A, and 4B, the preliminary active patterns 200P may be patterned to form active patterns 200. The active patterns 200 may be formed under the sacrificial gate pattern 310 and the spacer pattern 350. The forming of the active patterns 200 may include removing portions of the preliminary active patterns 200P from both sides of the sacrificial gate pattern 310. The removing of the portions of the preliminary active patterns 200P may include etching portions of the preliminary active patterns 200P using the mask pattern 330 and the spacer pattern 350 as an etching mask. The etching of the portions of the preliminary active patterns 200P may be performed until the upper surface of the base active pattern 110 is exposed on both sides of the sacrificial gate pattern 310. Accordingly, recess portions 250 defining the active pattern 200 may be formed.

The active patterns 200 may include a first active pattern 201 and a second active pattern 202. The first active pattern 201 may overlap the first region R1 of the substrate 100 in a plan view. The first active pattern 201 may be disposed on an upper surface of a first base active pattern 111. In an implementation, the first active pattern 201 may include first semiconductor patterns 210 and second semiconductor patterns 220, which are alternately stacked on the upper surface of the first base active pattern 111.

The second active pattern 202 may be spaced apart from the first active pattern 201 in the second direction D2 or in a direction opposite to the second direction D2 as shown in FIG. 4B. The second active pattern 202 may overlap the second region R2 of the substrate 100. The second active pattern 202 may be on an upper surface of a second base active pattern 112. The second active pattern 202 may include first semiconductor patterns 210 and second semiconductor patterns 220, which are alternately stacked on an upper surface of a second base active pattern 112. The sacrificial gate pattern 310 may be between the first active pattern 201 and the second active pattern 202 as shown in FIG. 4B.

A portion of the first semiconductor patterns 210 may be further removed horizontally to form recess regions 215. The recess regions 215 may be provided on both recessed sidewalls of the first semiconductor patterns 210. The recess regions 215 may be formed between the stacked second semiconductor patterns 220, and between the bottom layer of the second semiconductor patterns 220 and the base active pattern 110. The forming of the recess regions 215 may include performing an etching process on the sidewalls of the first semiconductor patterns 210 with an etching source having an etch selectivity with respect to the first semiconductor patterns 210. Each of the recess portions 250 may be connected to adjacent recess regions 215.

Figure 5A:
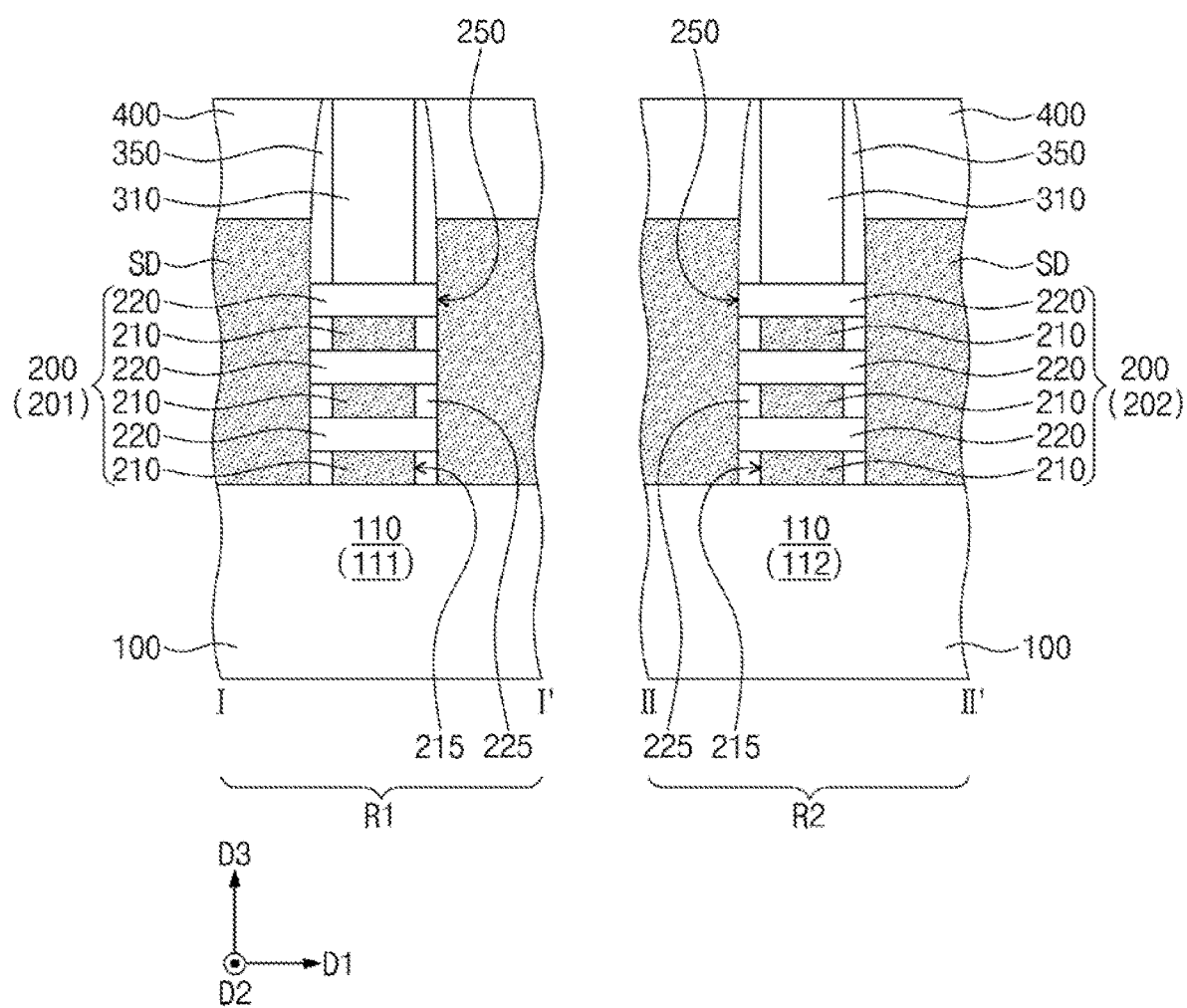
Figure 5B:
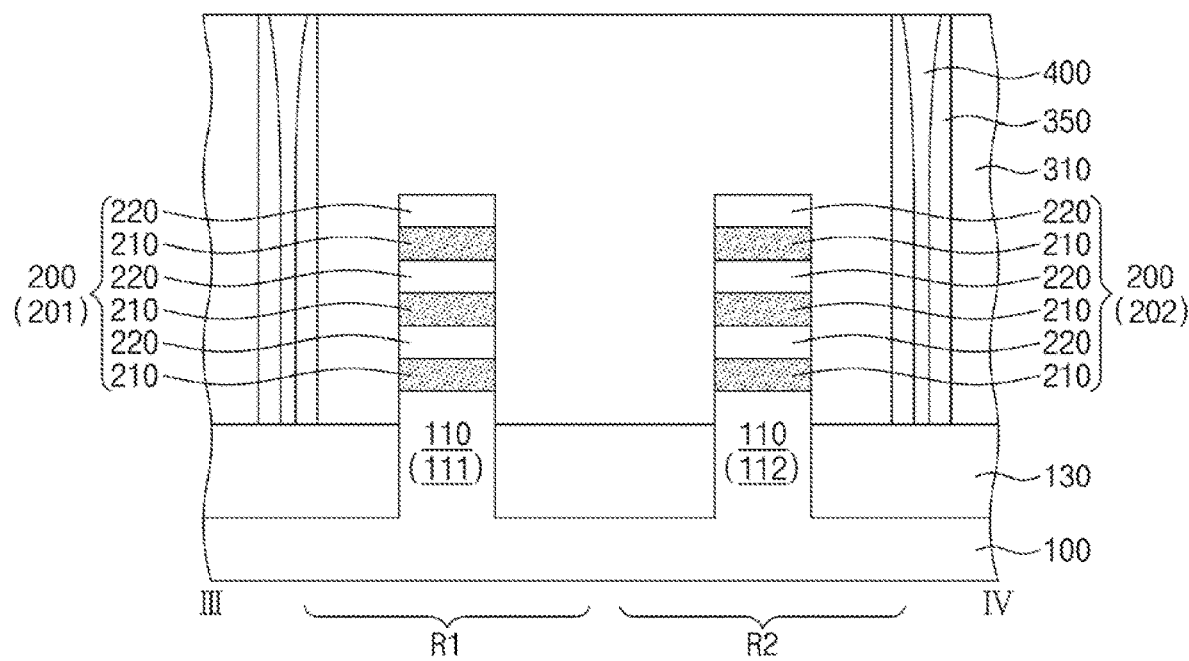
Figure 5B:
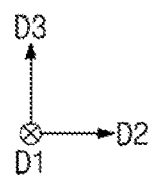

Referring to FIGS. 1, 5A, and 5B, insulating spacers 225 may be formed in the recess regions 215, respectively. The insulating spacers 225 may be formed on both recessed sidewalls of the first semiconductor patterns 210. The forming of the insulating spacers 225 may include conformally forming a barrier insulating film in sidewalls of the active pattern 200 and recess regions 215, and performing an anisotropic etching process on the barrier insulating film. In an implementation, the insulating spacers 225 may include silicon nitride or silicon oxynitride.

Source/drain patterns SD may be formed on the base active pattern 110 on both sides of the sacrificial gate pattern 310 as shown in FIG. 5A. The source/drain patterns SD may be formed by performing a selective epitaxial growth process using the second semiconductor patterns 220 and the base active pattern 110 as seeds from recess portions 250. The source/drain patterns SD may be provided in the recess portions 250, respectively. Each of the source/drain patterns SD may physically contact (e.g., directly contact) the exposed side surfaces of the second semiconductor patterns 220, and may physically contact the upper surface of the base active pattern 110. The source/drain patterns SD may physically contact the insulating spacers 225, respectively. The insulating spacers 225 may be between the source/drain patterns SD and the first semiconductor patterns 210. The source/drain patterns SD may be spaced apart from the first semiconductor patterns 210.

The source/drain patterns SD may include, e.g., silicon-germanium (SiGe), silicon (Si), or silicon carbide (SiC). The forming of the source/drain patterns SD may further include doping impurities in the source/drain patterns SD. The electrical characteristics of a transistor including the source/drain patterns SD may be improved by doping of impurities. When the transistor is an NMOSFET, the impurities may include, e.g., phosphorus (P), and when the transistor is a PMOSFET, the impurities may include, e.g., boron (B).

An interlayer insulating film 400 may be formed on the substrate 100 to cover the source/drain patterns SD. The forming of the interlayer insulating film 400 may include forming an insulating film covering the source/drain patterns SD, the sacrificial gate pattern 310, and the spacer pattern 350 on the substrate 100, and planarizing the insulating film until the sacrificial gate pattern 310 is exposed. In the planarization process, the mask pattern 330 may be removed. The interlayer insulating film 400 may include a silicon oxide film, a silicon nitride film, a silicon oxynitride film, or a low dielectric film.

Figure 6A:
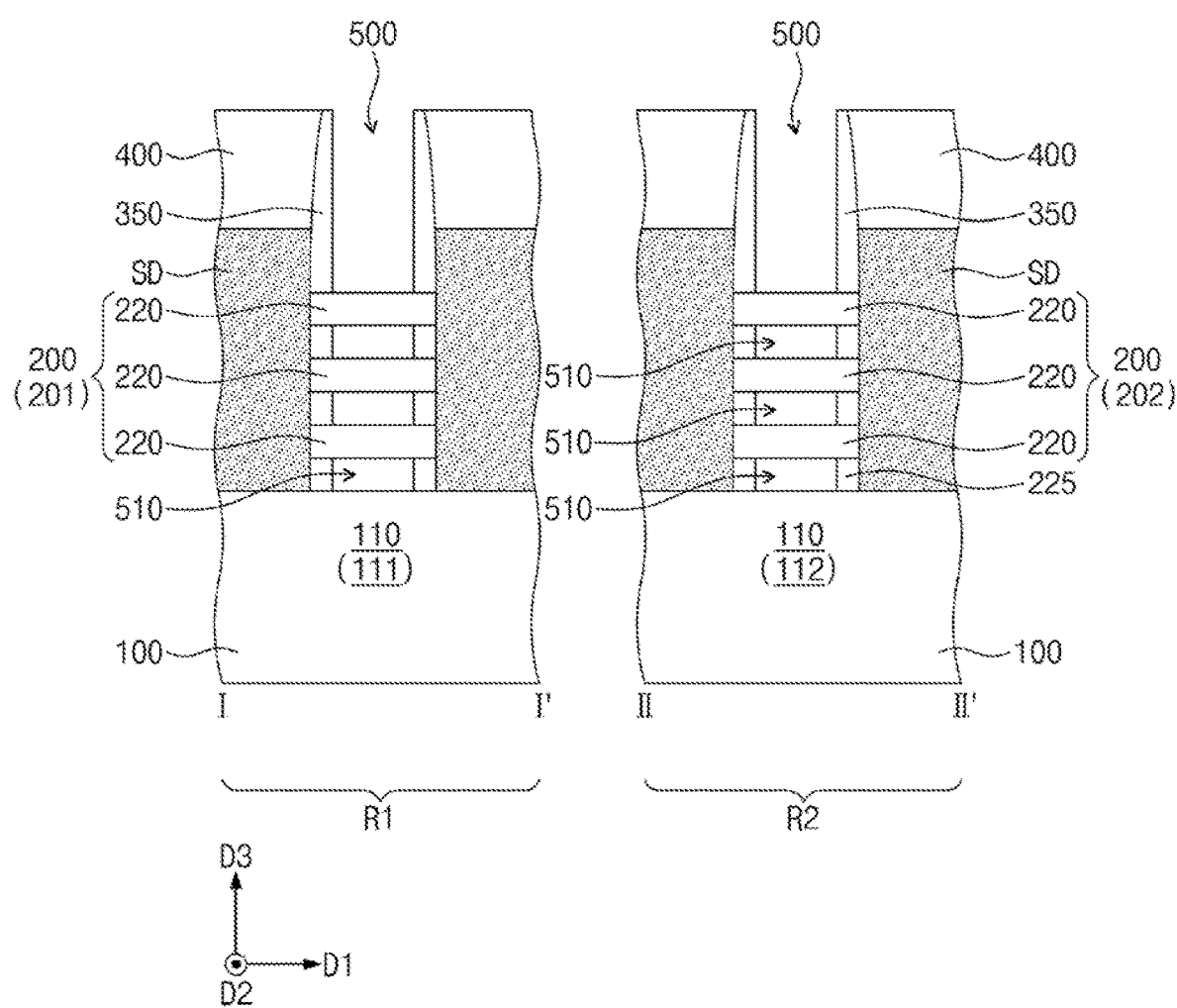
Figure 6B:
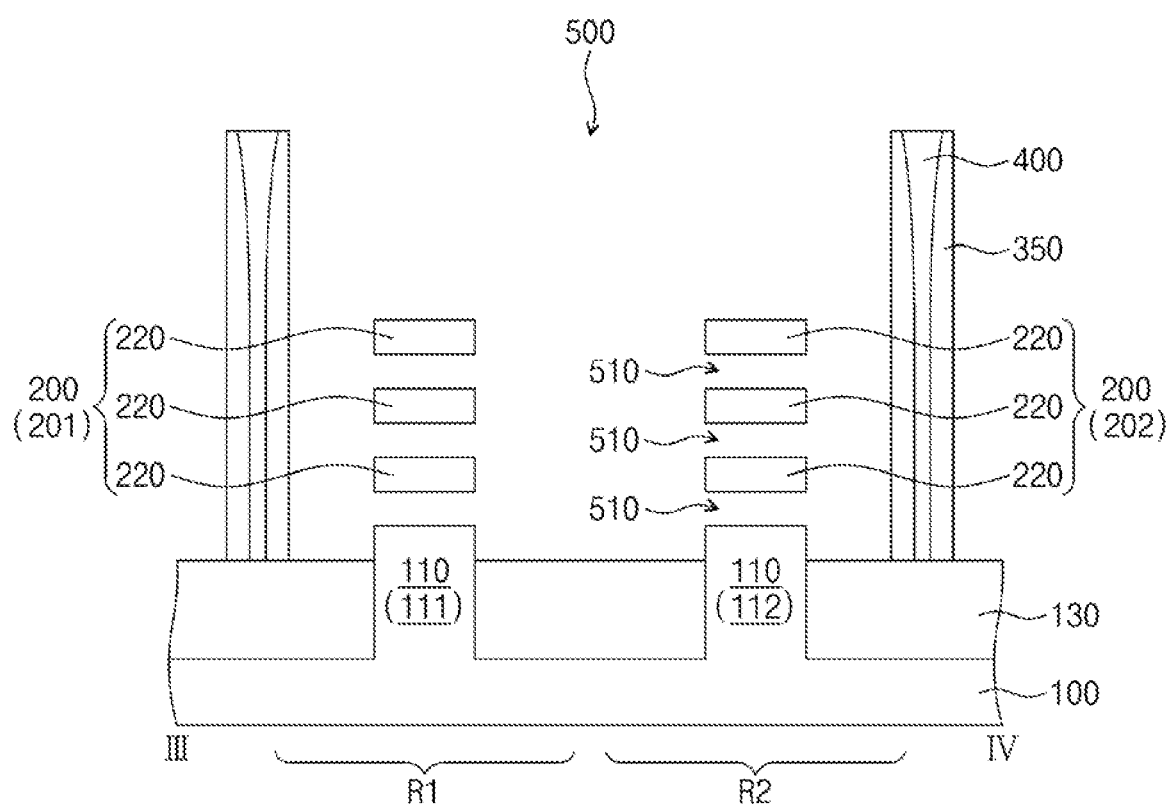
Figure 6B:
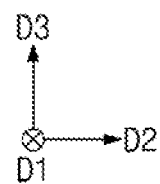
Figure 7A:
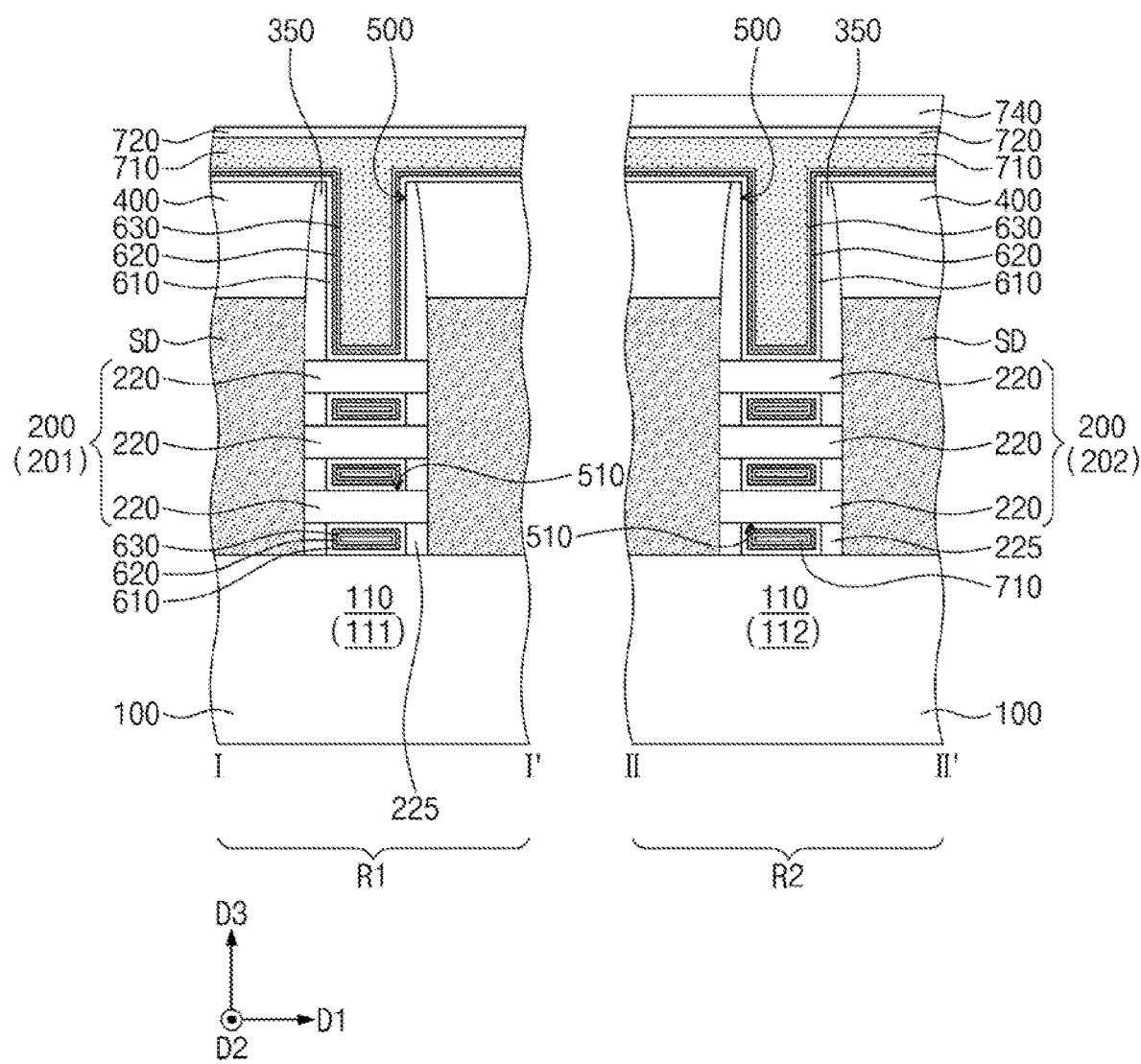
Figure 7B:
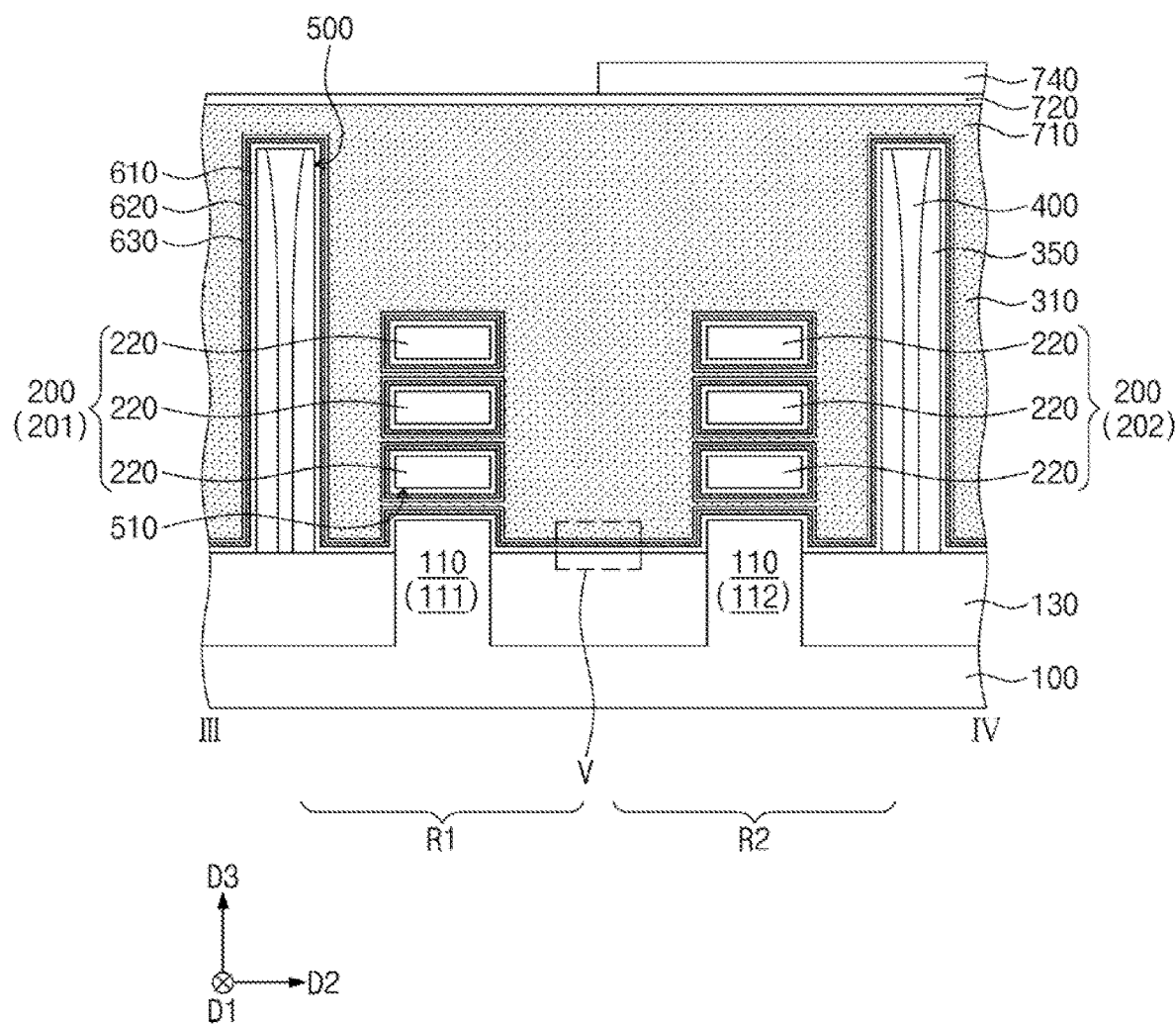
Figure 7C:
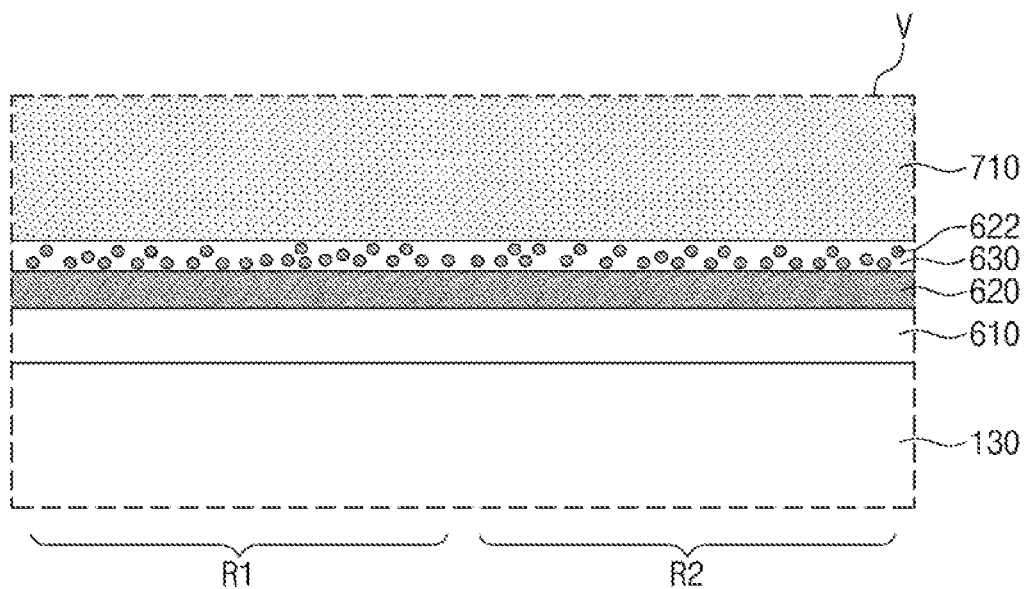
FIG. 7C is an enlarged view of a region V of FIG. 7B.

Referring to FIGS. 1, 6A, and 6B, the sacrificial gate pattern 310 is removed to form an opening 500 in the interlayer insulating film 400. The opening 500 may expose the active pattern 200 between the spacer patterns 350. The forming of the opening 500 may include performing an etching process having an etch selectivity with respect to the spacer pattern 350 and the interlayer insulating film 400 to etch the sacrificial gate pattern 310. The opening 500 may have a line shape extending in the second direction D2 in a plan view. As shown in FIG. 6B, the opening 500 may expose upper surfaces of the device isolation patterns 130, an upper surface of the uppermost layer among the second semiconductor patterns 220, sidewalls of the second semiconductor patterns 220, and an inner wall of the spacer pattern 350.

The first semiconductor patterns 210 exposed by the opening 500 may be removed by an etching process to form gate regions 510. The gate regions 510 may be formed between the second semiconductor patterns 220, and between the bottom layer among the second semiconductor patterns 220 and the base active pattern 110. The gate regions 510 may be empty regions. The gate regions 510 may be connected to the opening 500.

Referring to FIGS. 1, 7A, 7B, and 7C, a first gate insulating film 610, a metal oxide film 620, and a metal-containing film 630 may be formed in the opening 500 and the gate regions 510 on the first region R1 and the second region R2 of the substrate 100. The first gate insulating film 610 may conformally cover the opening 500 and inner surfaces of the gate regions 510. In an implementation, the first gate insulating film 610 may cover exposed upper and lower surfaces of the second semiconductor patterns 220, an inner wall of the spacer pattern 350, inner walls of the insulating spacers 225, and an upper portion of the first base active pattern 111, an upper portion of the second base active pattern 112, and upper surfaces of the device isolation patterns 130. The first gate insulating film 610 may include a high dielectric material, and the high dielectric material may have a higher dielectric constant than silicon oxide. The first gate insulating film 610 may include a first metal, and the first metal may include hafnium, zinc, or titanium. In an implementation, the first gate insulating film 610 may include hafnium oxide ($Hf_xO_y$). In an implementation, the first gate insulating film 610 may include zinc oxide ($Zr_xO_y$) or titanium oxide ($Ti_xO_y$). x and y are independently positive real numbers.

A metal oxide film 620 may be formed on the first gate insulating film 610 to conformally cover the first gate insulating film 610. The metal oxide film 620 may include a second metal and oxygen. The second metal may include lanthanum or aluminum.

A metal-containing film 630 may be formed on the metal oxide film 620 to conformally cover the metal oxide film 620. The metal-containing film 630 may include a metal nitride film. The metal-containing film 630 may include a third metal, and the third metal may be different from the second metal. In an implementation, the third metal may be titanium. In an implementation, a portion of the second metal 622 included in the metal oxide film 620 may be diffused into the metal-containing film 630 as shown in FIG. 7C. Accordingly, the metal-containing film 630 may further include the second metal 622. In an implementation, the metal-containing film 630 may include a titanium nitride film including lanthanum or aluminum.

A first mask film 710 may be formed on the metal-containing film 630 to cover the metal-containing film 630. The first mask film 710 may fill the remainder of the opening 500 and the gate regions 510, and may extend on an upper surface of the interlayer insulating film 400. The first mask film 710 may include a bottom anti-reflective coating (BARC) material. The first mask film 710 may include, e.g., an organic material or silicon oxide nitride.

A second mask film 720 may be formed on the first mask film 710. The second mask film 720 may include metal oxide. In an implementation, the second mask film 720 may include, e.g., titanium oxide.

A resist pattern 740 may be formed on the second mask film 720 to cover a portion of the second mask film 720. In an implementation, the resist pattern 740 may overlap the second region R2 of the substrate 100 in a plan view. The resist pattern 740 may expose an upper surface of the second mask film 720 on the first region R1 of the substrate 100. The resist pattern 740 may include an organic material, e.g., a photoresist material.

Figure 8A:
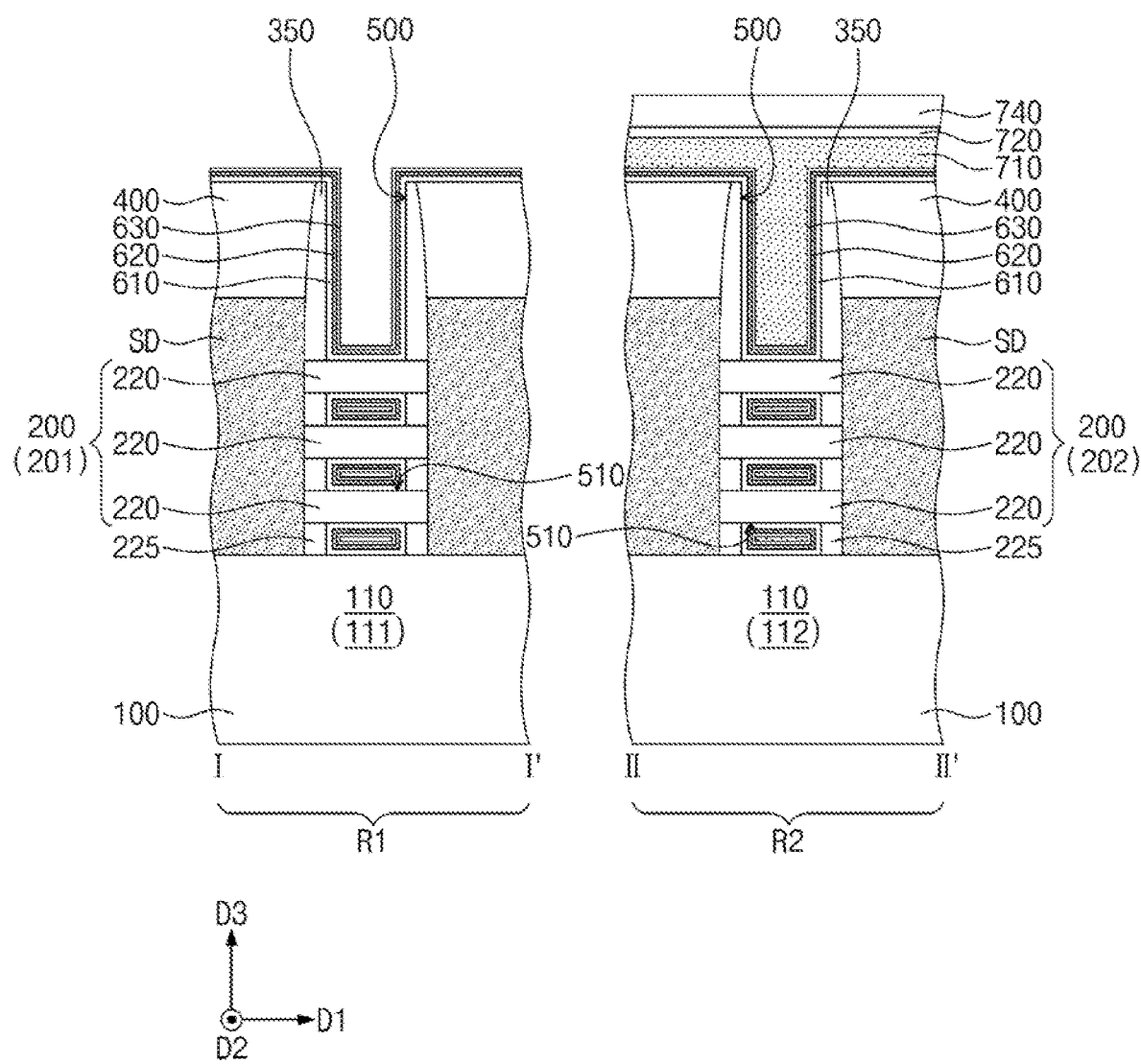
Figure 8B:
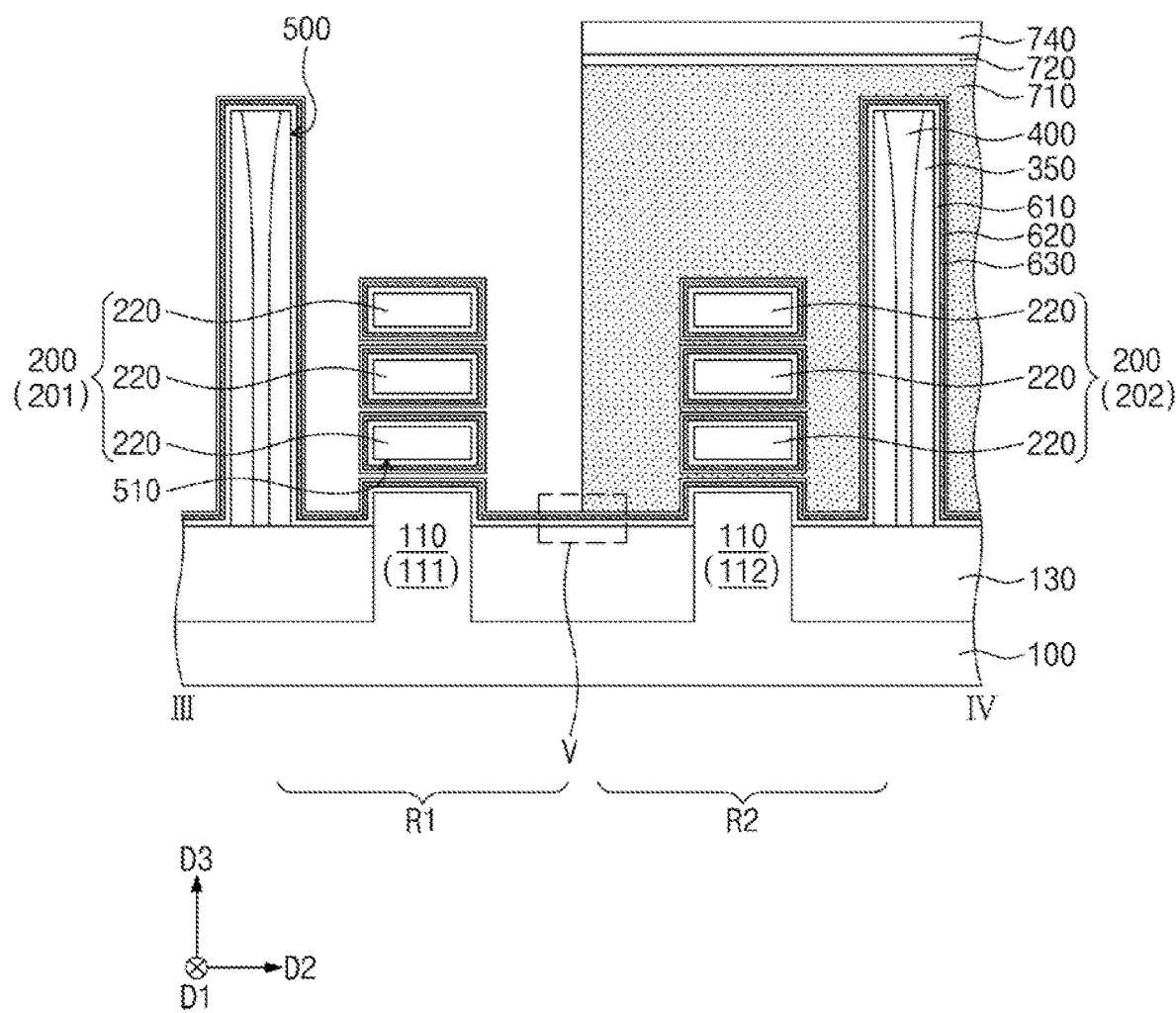
Figure 8C:
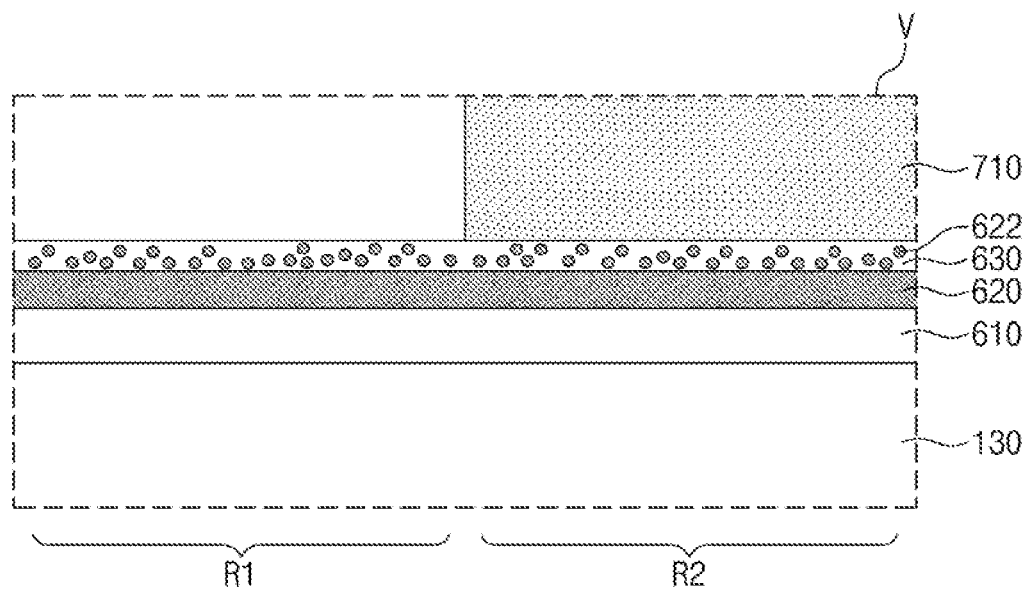
FIG. 8C is an enlarged view of a region V of FIG. 8B.

Referring to FIGS. 8A, 8B, and 8C, the second mask film 720 exposed to the resist pattern 740 and the first mask film 710 may be removed. Accordingly, the metal-containing film 630 on the first region R1 of the substrate 100 may be exposed. In this case, the first mask film 710 and the second mask film 720 on the second region R2 of the substrate 100 may not be removed.

Figure 9A:
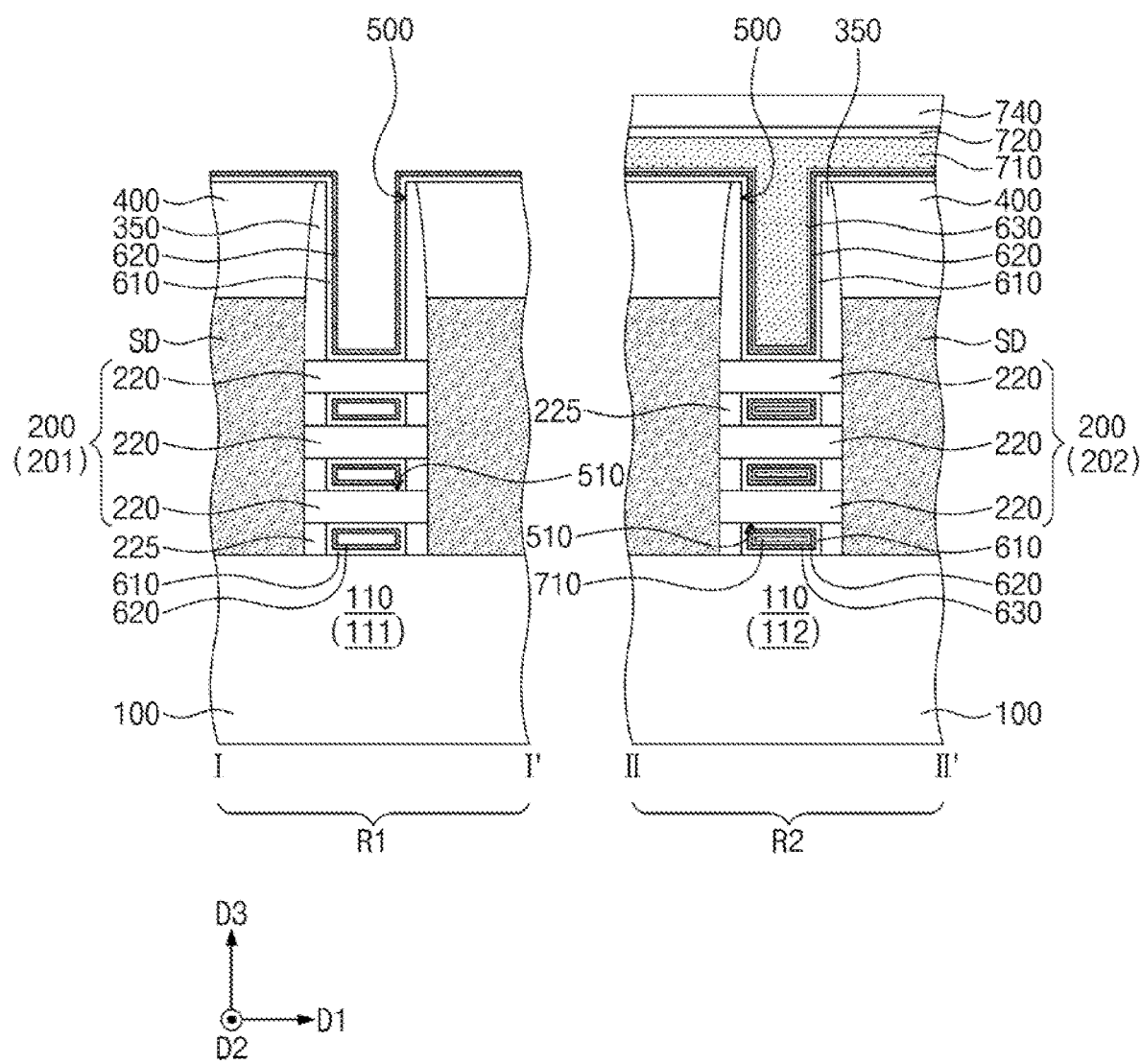
Figure 9B:
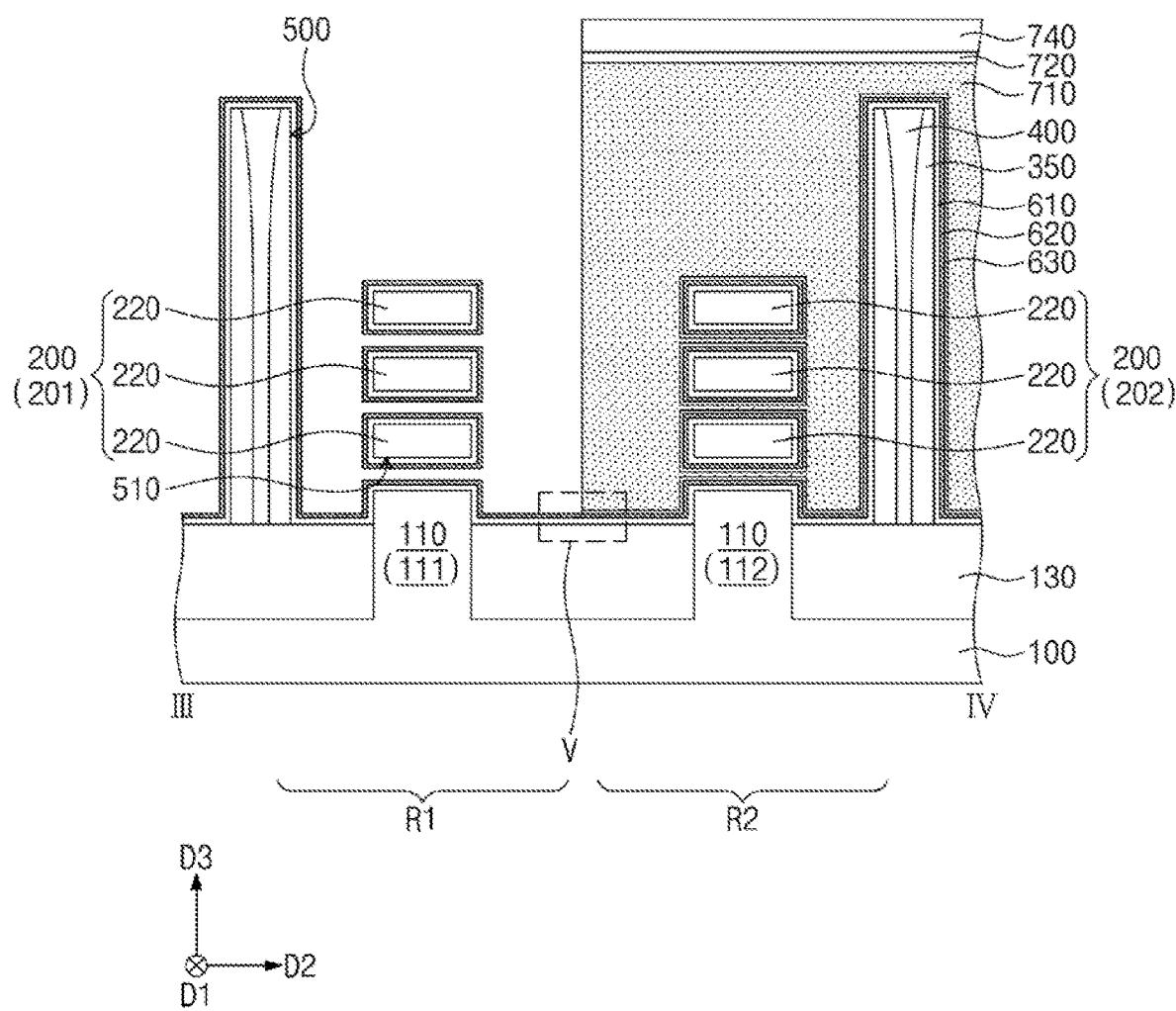
Figure 9C:
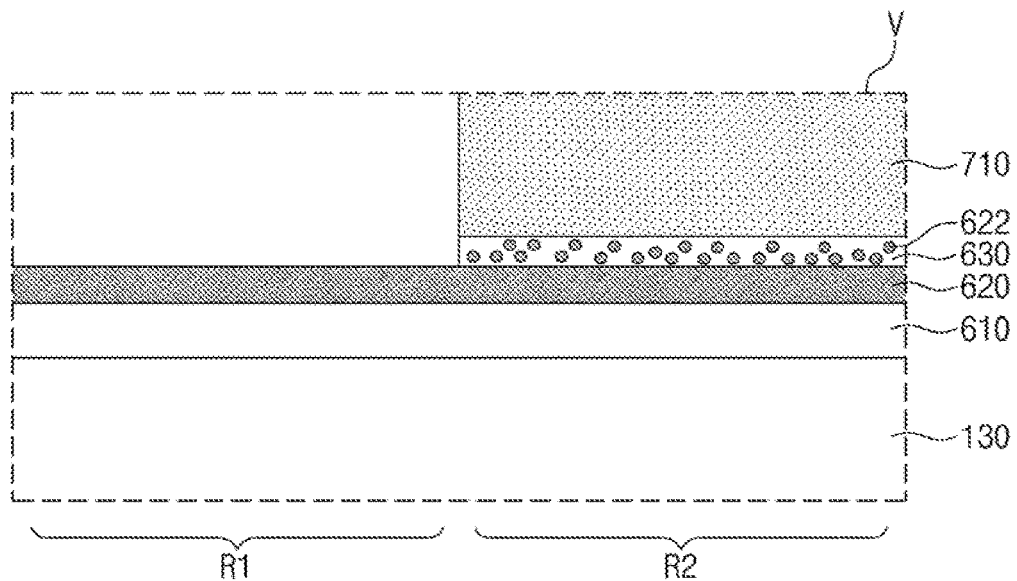
FIG. 9C is an enlarged view of a region V of FIG. 9B.
Figure 9D:
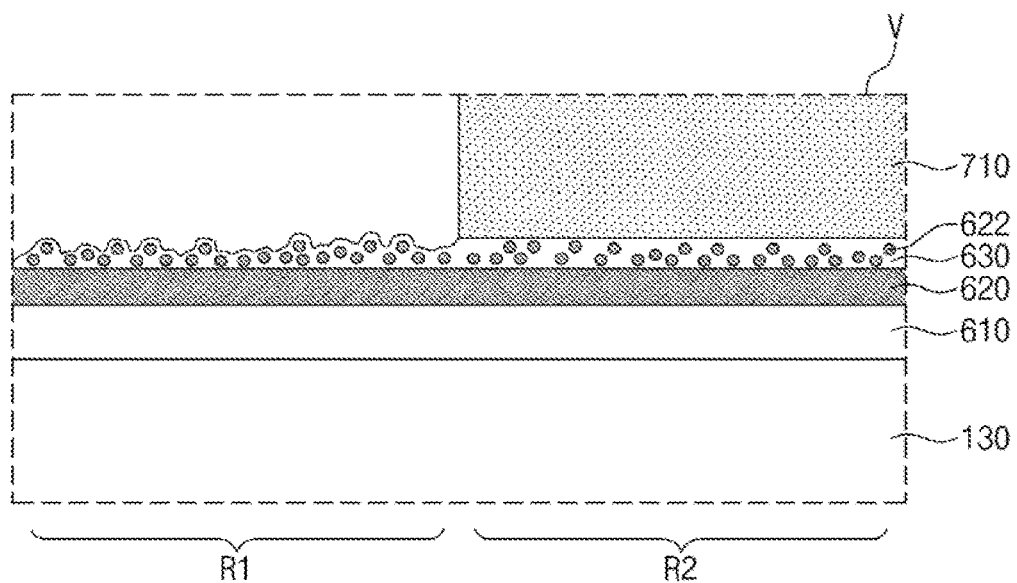
FIG. 9D is a view showing results of an etching process using an etching composition according to another embodiment.

Referring to FIGS. 9A, 9B, and 9C, an etching process (using the etching composition according to an embodiment) may be performed on the exposed metal-containing film 630. The etching process of the metal-containing film 630 may be performed such that the metal-containing film 630 has an etch selectivity with respect to the first mask film 710, the second mask film 720, and the resist pattern 740. The metal-containing film 630 may be a titanium nitride film including lanthanum or aluminum as described above.

The etching composition may be the same as described above. In an implementation, the etching composition may include an oxidizing agent, a pH adjusting agent, and a chelating agent. The oxidizing agent of the etching composition may remove the third metal (e.g., titanium) included in the metal-containing film 630. In an implementation, the oxidizing agent may be included in an amount of 5 wt % or more, and the etching rate of the metal-containing film 630 may be improved. The etching composition according to embodiments may include 30 wt % or less of the oxidizing agent to help prevent undesired etching of the first mask film 710 or the resist pattern 740 during the etching process. The pH adjusting agent may facilitate etching of the third metal.

FIG. 9D is a view for explaining results of an etching process using an etching composition according to another example, and corresponds to an enlarged view of a region V of FIG. 9B. Hereinafter, a chelating agent of an etching composition will be described in detail with reference to FIGS. 9C and 9D.

Referring to FIG. 9D, the metal-containing film 630 may further include a second metal 622, and it may be difficult for the oxidizing agent of the etching composition to remove the second metal 622. If the etching composition were to not include a chelating agent, a portion of the metal-containing film 630 may remain on the first region R1 of the substrate 100 after the etching process is completed. The remaining portion of the metal-containing film 630 may be a portion including the second metal 622. In this case, even after the etching process is completed, the metal oxide film 620 on the first region R1 of the substrate 100 may not be exposed.

Referring back to FIGS. 8C and 9C in turn, the etch composition according to the embodiments may further include a chelating agent, and the chelating agent may interact with the second metal 622 to remove the second metal 622. The pH adjusting agent of the etching composition according to embodiments may facilitate removing the second metal 622. Even when the metal-containing film 630 further includes the second metal 622, as a result of the etching process using the etching composition according to embodiments, the metal-containing film 630 may be removed well, and an upper surface of the metal oxide film 620 may be exposed.

In an implementation, the chelating agent may be included in an amount of 0.1 wt % to 5 wt %, and the etching rate of the metal oxide film 620 may be further improved. In an implementation, the pH adjusting agent may be included in an amount of 1 wt % to 15 wt %, and the etching process using the etching composition may exhibit an improved etch selectivity with respect to the metal-containing film 630.

The pH of the etching composition may be controlled by a pH adjusting agent and a chelating agent. In an implementation, the pH adjusting agent may be included in an amount of 1 wt % to 15 wt %, the chelating agent may be included in an amount of 0.1 wt % to 5 wt %, and the etching composition may satisfy pH conditions of 4.0 to 5.8. In an implementation, the pH of the etching composition may be 4.0 to 5.8, and during the etching process using the etching composition, the etching rate of the metal-containing film 630 may be further improved. In an implementation, the first metal and the second metal in the metal-containing film 630 may be removed well. The etching process may be performed by a wet etching process.

The etching process may be performed using an etching composition at approximately 45° C. to 80° C. Maintaining the temperature of the etching composition at 45° C. or greater may help prevent a reduction in the etching rate of the metal-containing film 630. Maintaining the temperature of the etching composition at 80° C. or less may help prevent decomposition of the oxidizing agent.

Figure 10A:
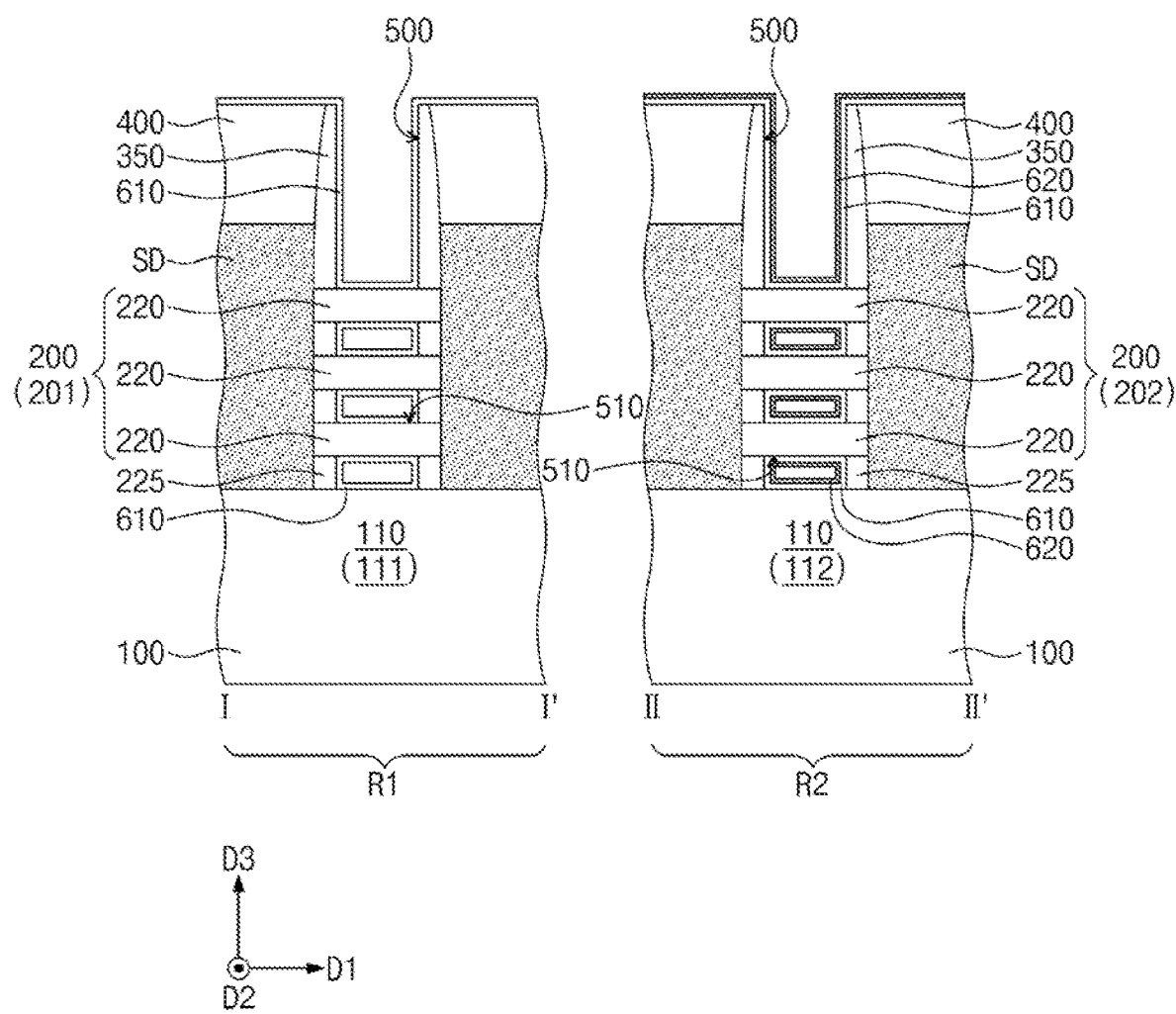
Figure 10B:
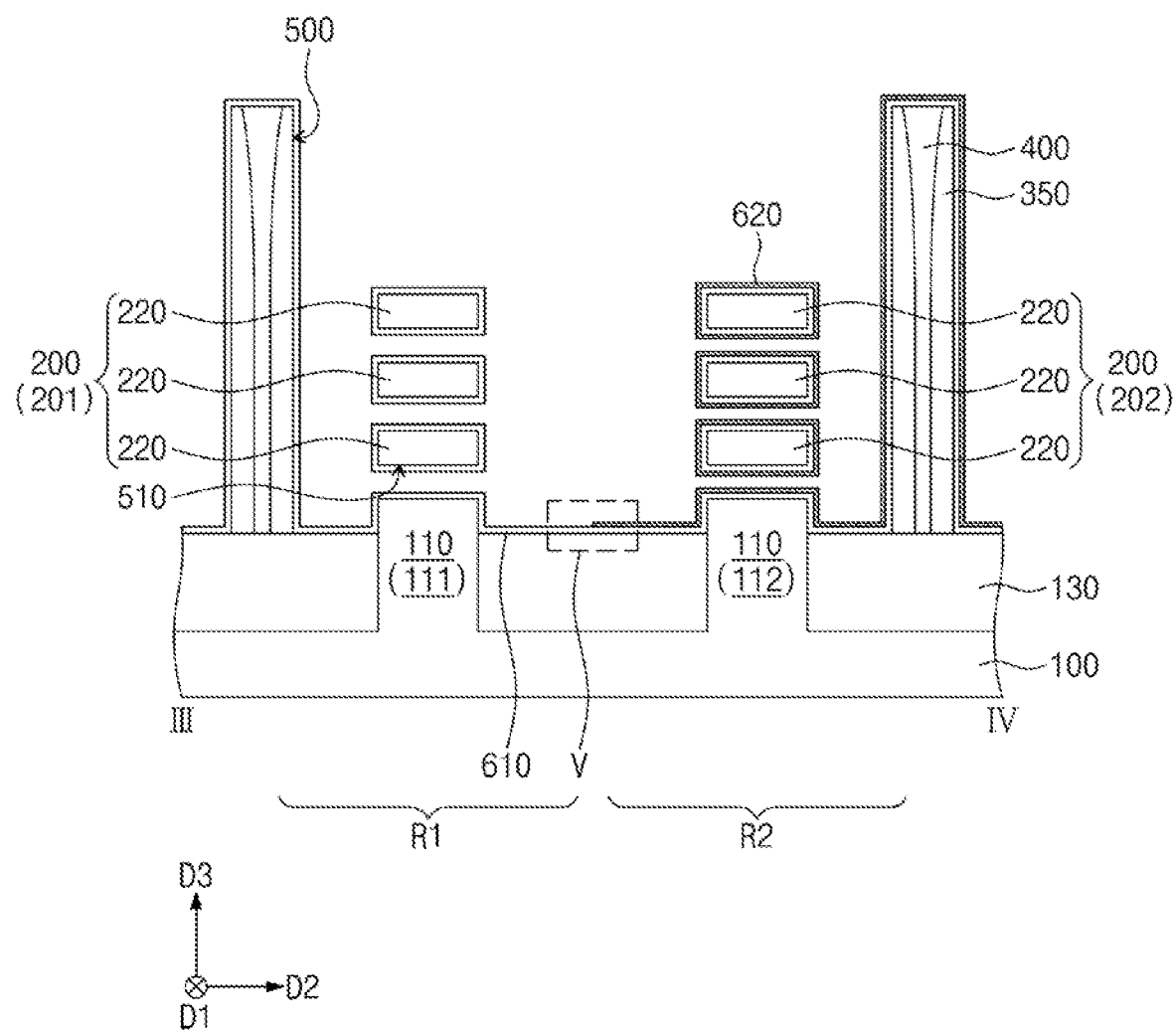
Figure 10C:
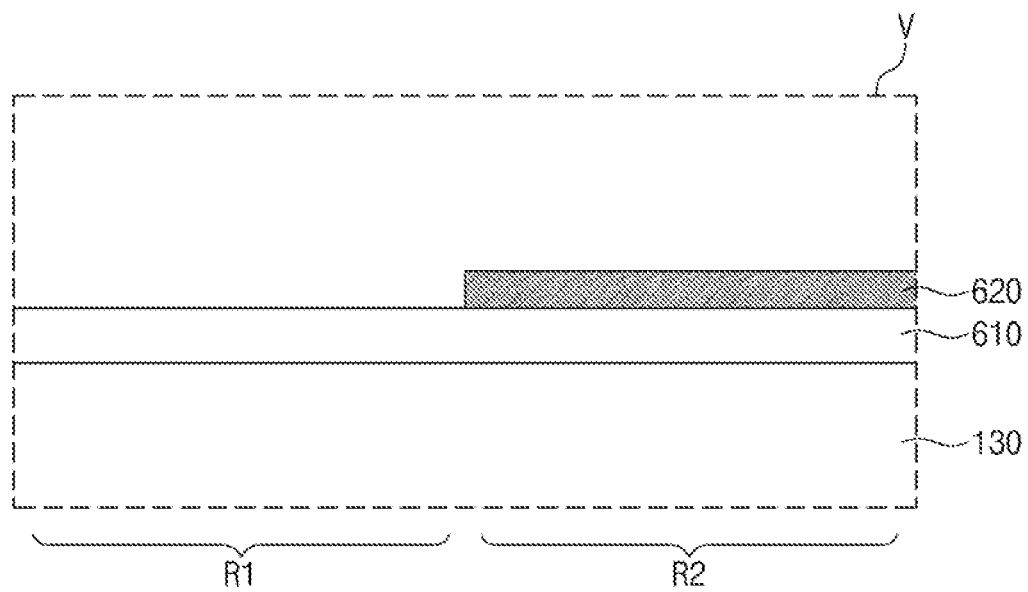
FIG. 10C is an enlarged view of a region V of FIG. 10B.

Referring to FIGS. 10A, 10B, and 10C, the metal oxide film 620 on the first region R1 of the substrate 100 may be removed to expose the first gate insulating film 610. The removing of the metal oxide film 620 may include performing an etching process having an etch selectivity with respect to the first gate insulating film 610.

As a result of the etching process, the resist pattern 740, the second mask film 720, the first mask film 710, and the metal-containing film 630 on the second region R2 of the substrate 100 may be removed. In an implementation, the metal oxide film 620 may not be exposed by the metal-containing film 630 during the removal process of the first mask film 710. Accordingly, in the first mask film 710 process, undesired etching of the metal oxide film 620 may be prevented. The process of removing the metal oxide film 620 on the second region R2 of the substrate 100 may not be performed. The metal oxide film 620 on the second region R2 of the substrate 100 may remain and may be exposed by the opening 500 and the gate regions 510.

Figure 11A:
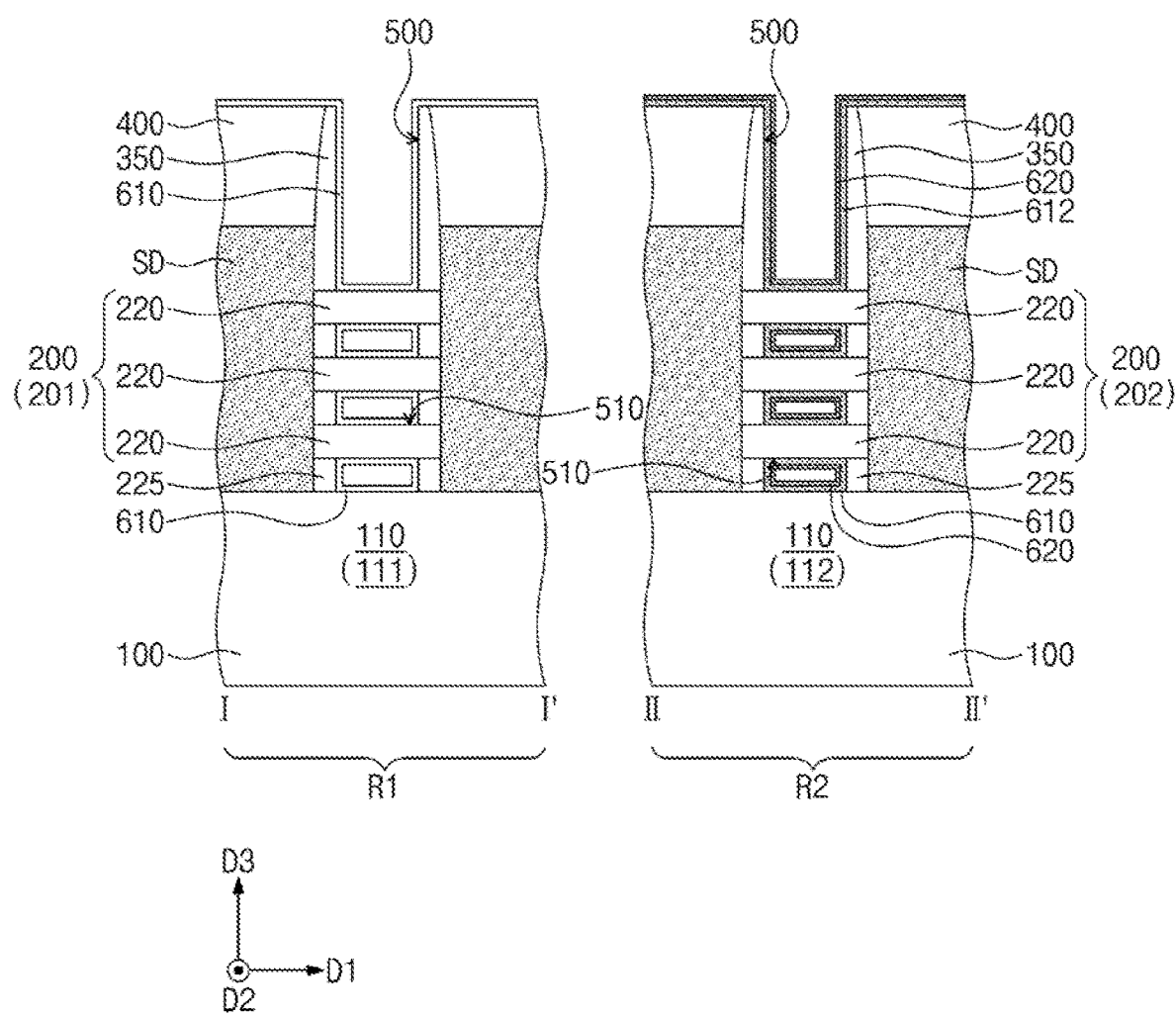
Figure 11B:
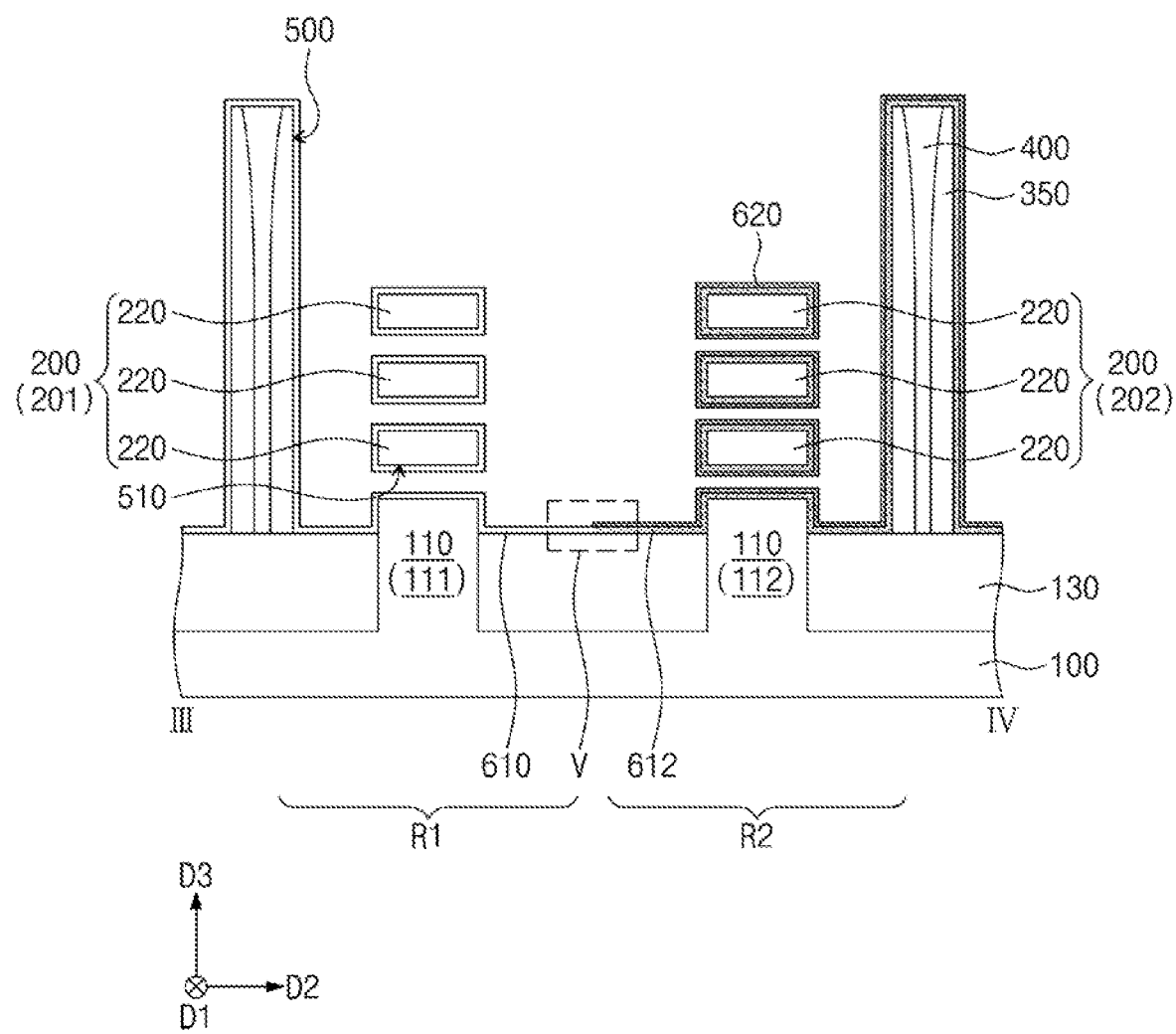
Figure 11C:
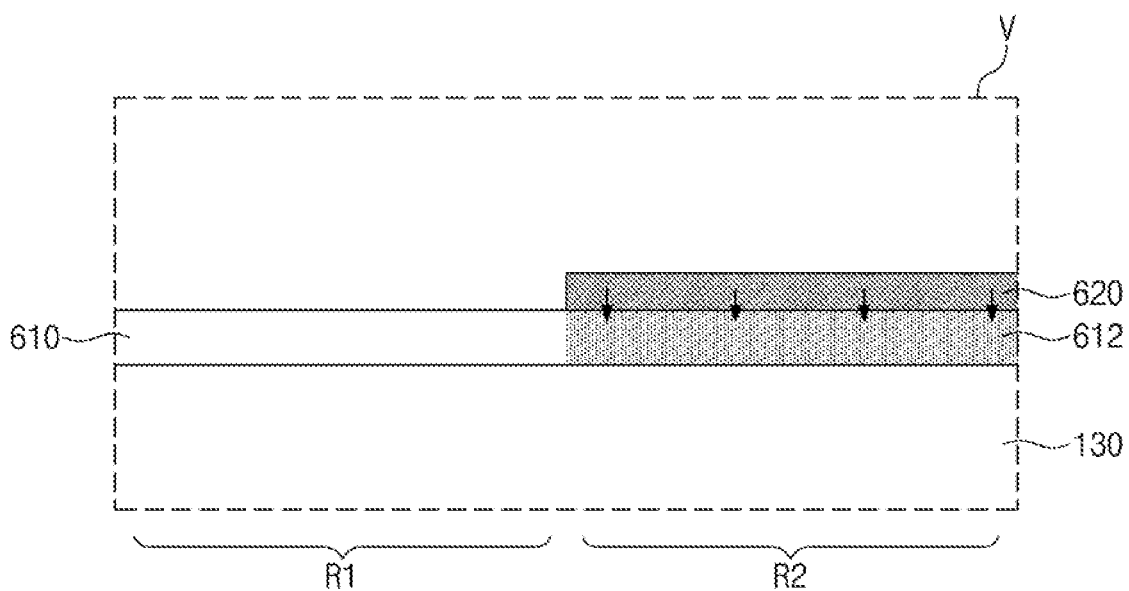
FIG. 11C is an enlarged view of a region V of FIG. 11B.

Referring to FIGS. 11A, 11B, and 11C, an annealing process may be performed on the first gate insulating film 610 and the metal oxide film 620. The annealing process may be performed at a temperature of about 400° C. to about 1,200° C. Referring to FIGS. 10C and 11C in turn, during the annealing process, the second metal included in the metal oxide film 620 may move into the first gate insulating film 610. The arrow in FIG. 11C schematically shows the movement of the second metal. A portion of the first gate insulating film 610 further including the second metal may form a second gate insulating film 612. The second gate insulating film 612 may be on the second region R2 of the substrate 100 and may physically contact the metal oxide film 620 under the metal oxide film 620. The second gate insulating film 612 may include a first metal and a second metal. The second gate insulating film 612 may be provided on a second base active pattern 112 and a second active pattern 202.

In an implementation, during the removal process of the first mask film 710 described with reference to FIGS. 10A, 10B, and 10C, the metal-containing film 630 on the second region R2 of the substrate 100 protects the metal oxide film 620, so that the second gate insulating film 612 may be well formed in the annealing process.

As described with reference to FIGS. 9C and 9D, the metal-containing film 630 on the first region R1 of the substrate 100 may be well removed by using the etching composition according to embodiments. Therefore, the metal oxide film 620 on the first region R1 of the substrate 100 may be well removed in a subsequent process. In the annealing process, the metal oxide film 620 may be selectively provided on the second region R2 of the substrate 100. It may be difficult for the second metal included in the metal oxide film 620 to move into the first gate insulating film 610 on the first region R1 of the substrate 100. Accordingly, the second gate insulating film 612 may be selectively formed on the second region R2 of the substrate 100. After the annealing process, the first gate insulating film 610 may remain on the first region R1 of the substrate 100 to cover a first base active pattern 111 and a first active pattern 201. The first gate insulating film 610 may include the first metal, and may not include the second metal. The second gate insulating film 612 may be connected to the first gate insulating film 610 without a boundary surface.

Figure 12A:
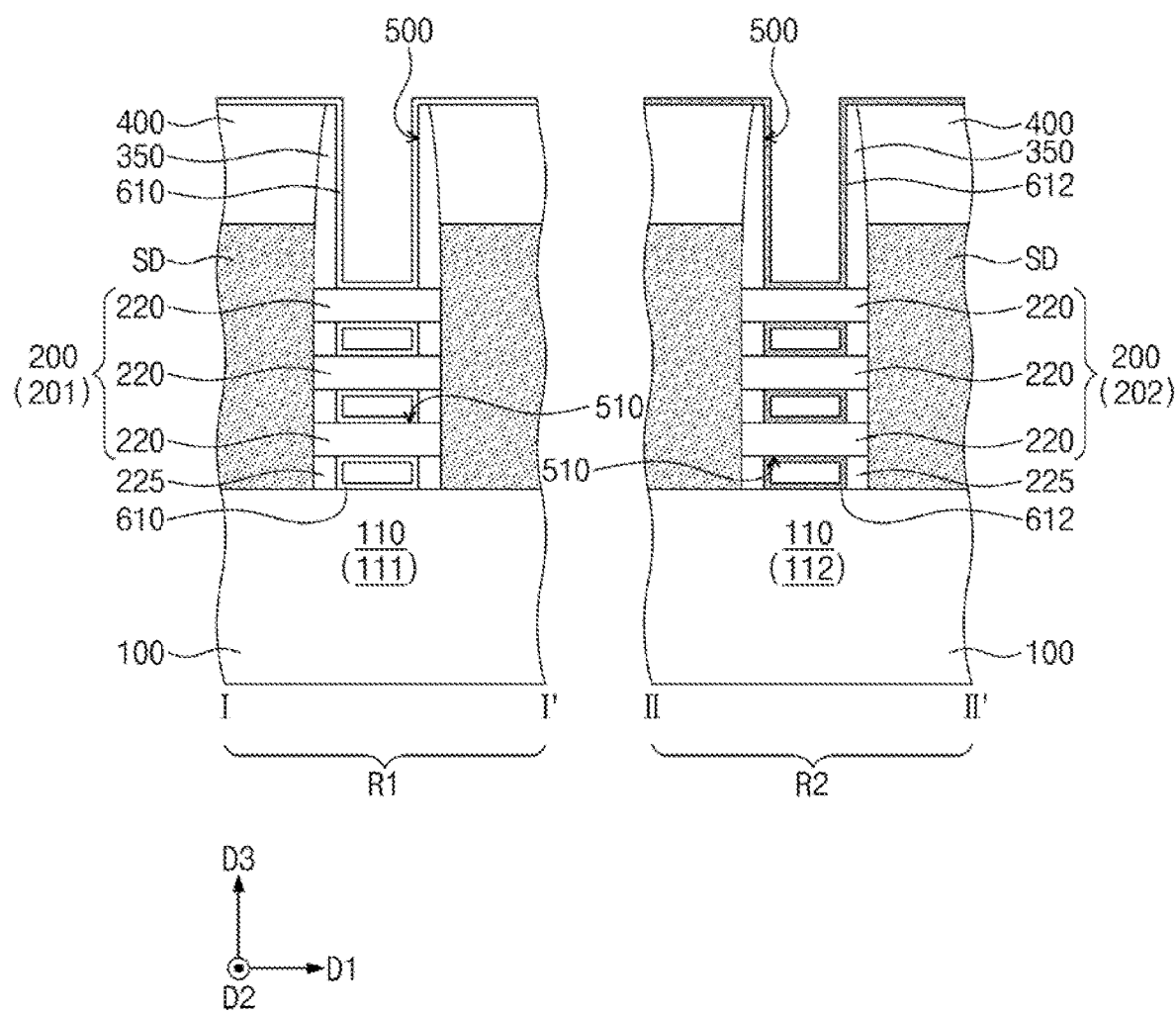
Figure 12B:
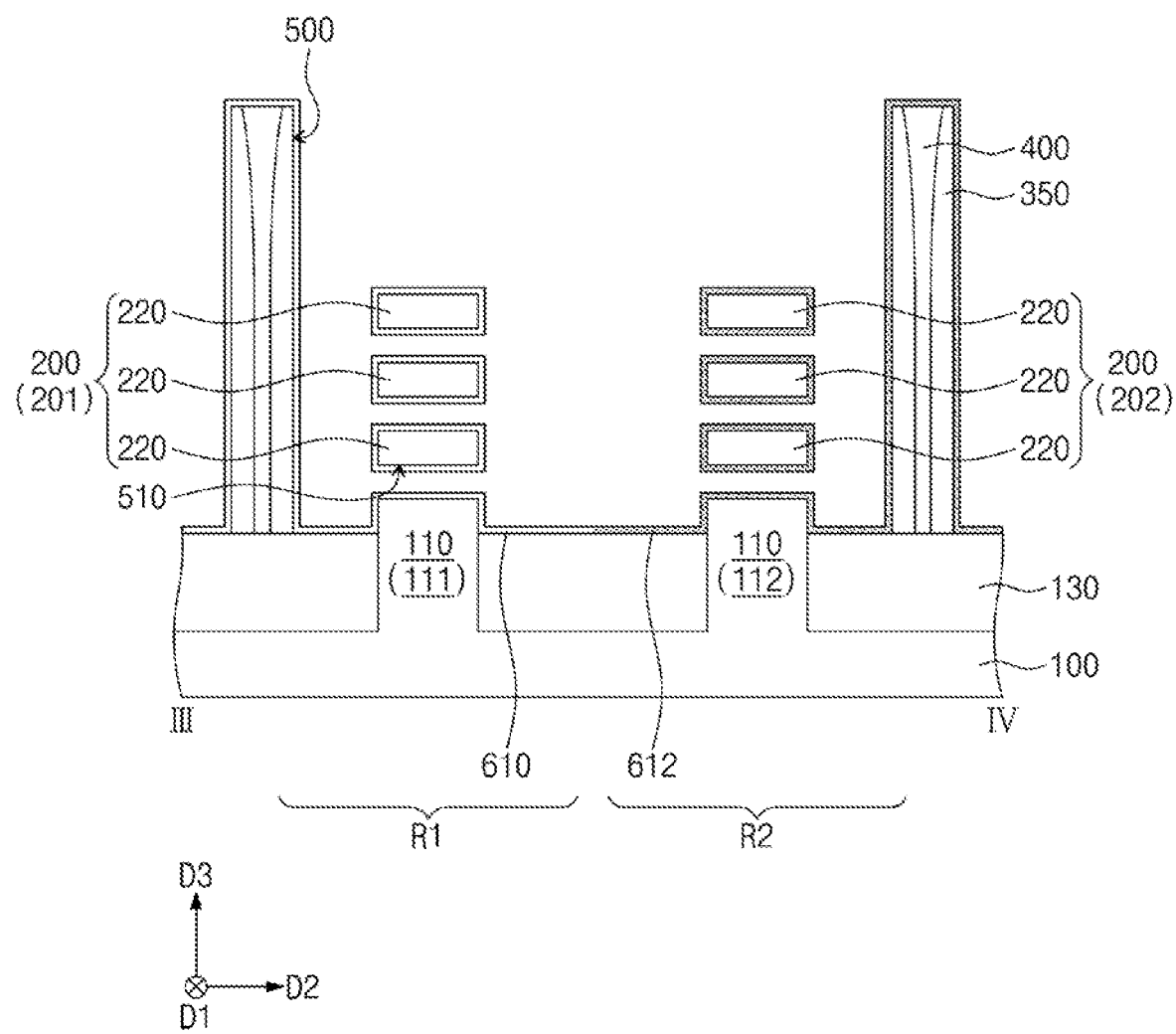
Figure 12C:
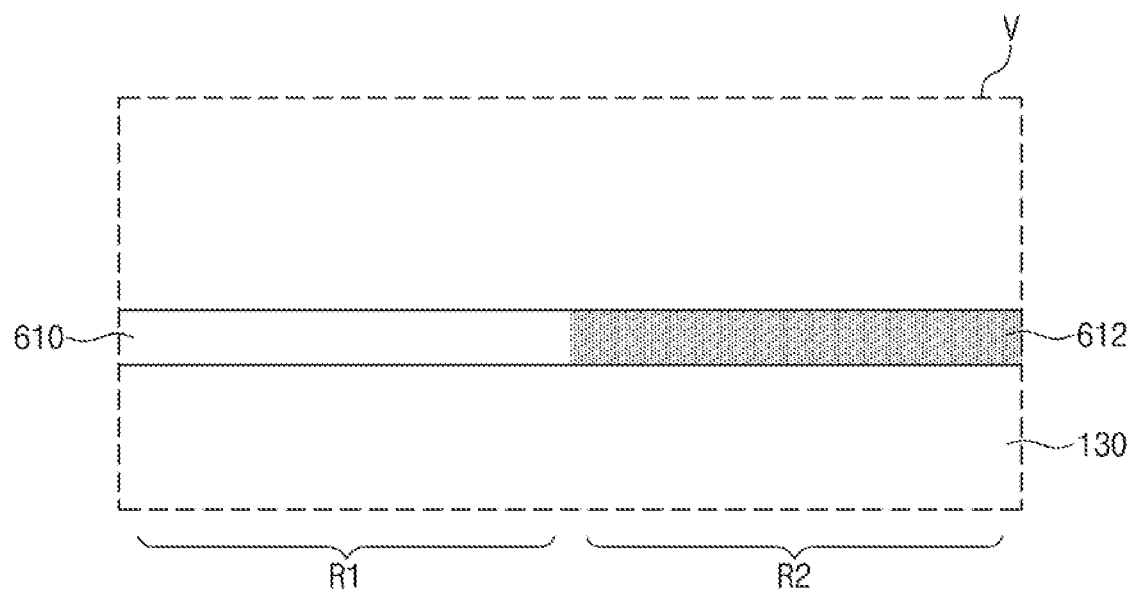
FIG. 12C is an enlarged view of a region V of FIG. 12B.

Referring to FIGS. 12A, 12B, and 12C, the metal oxide film 620 may be removed to expose the second gate insulating film 612. The removing of the metal oxide film 620 may include performing an etching process having an etch selectivity with respect to the first gate insulating film 610 and the second gate insulating film 612.

Figure 13A:
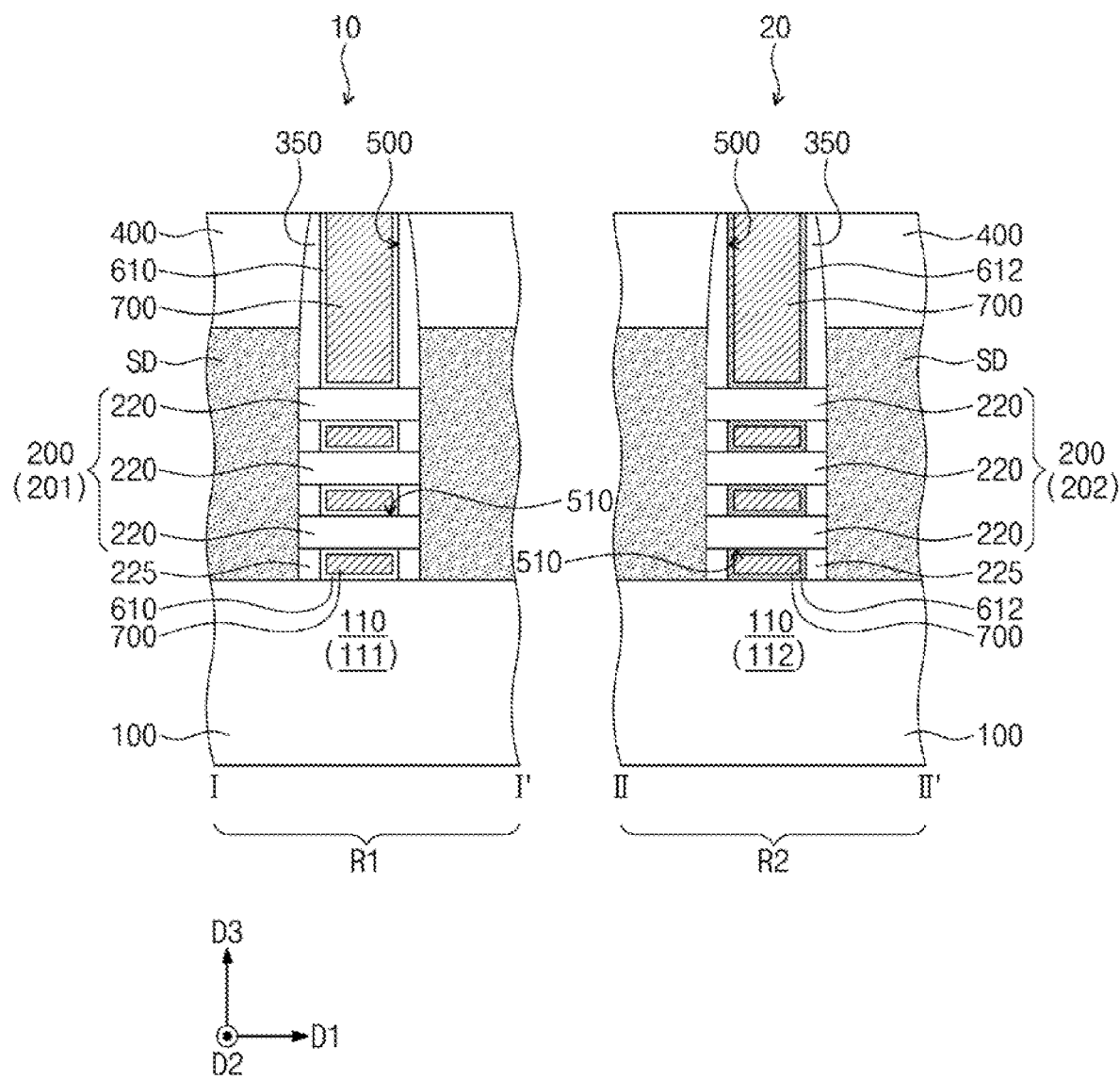
Figure 13B:
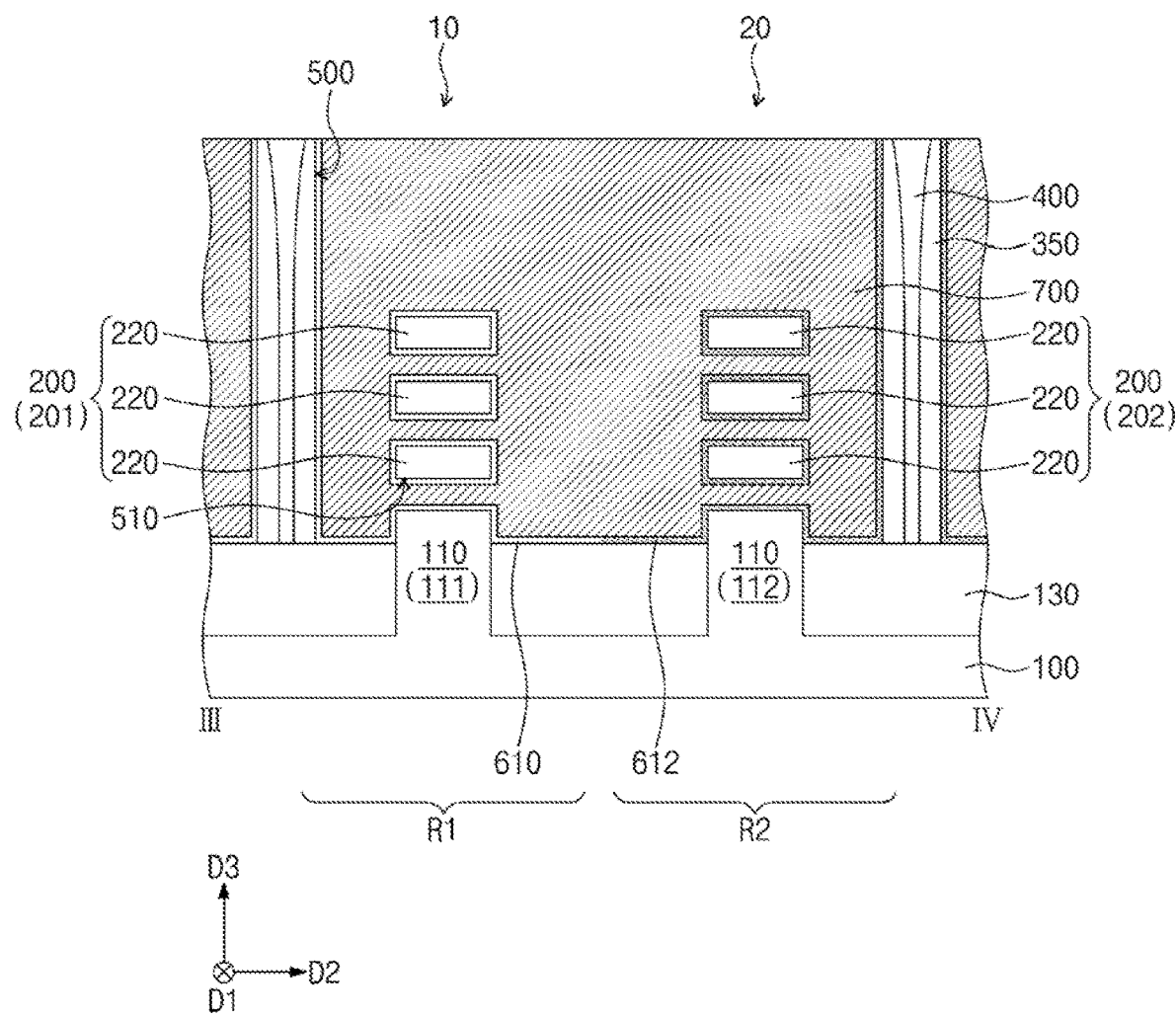
Figure 13C:
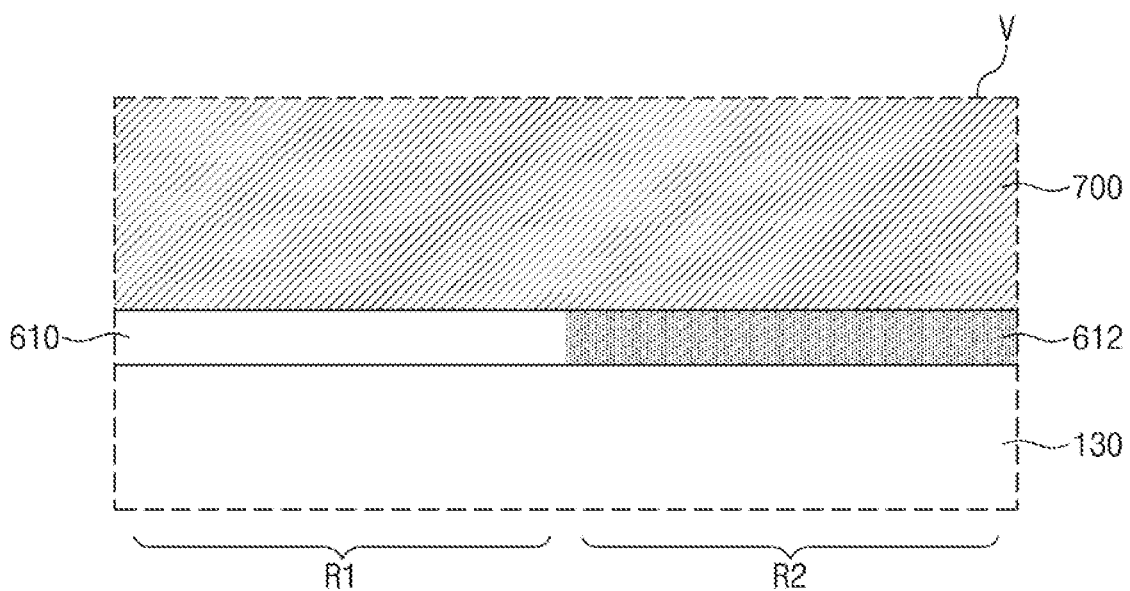
FIG. 13C is an enlarged view of a region V of FIG. 13B.

Referring to FIGS. 13A, 13B, and 13C, a gate pattern 700 may be formed on the first gate insulating film 610 and the second gate insulating film 612 to form a first transistor 10 and a second transistor 20. The gate pattern 700 may fill the opening 500 and the gate regions 510. The forming of the gate pattern 700 may include forming a gate conductive film filling a remaining portion of the opening 500 and the gate regions 510, and performing a planarization process until the interlayer insulating film 400 is exposed in order to form the gate pattern 700 in the opening 500 and the gate regions 510 locally. During the planarization process, a portion of the first gate insulating film 610 and a portion of the second gate insulating film 612 on an upper surface of the interlayer insulating film 400 may be removed together. In an implementation, the gate pattern 700 may include a doped semiconductor, a conductive metal nitride, or a metal.

The gate pattern 700 may be on the first gate insulating film 610 and the second gate insulating film 612, and may be spaced apart from the second semiconductor patterns 220 and the base active pattern 110. The gate pattern 700 may be spaced apart from the source/drain patterns SD with the insulating spacers 225 therebetween. The second semiconductor patterns 220 may function as a channel of a transistor. The second semiconductor patterns 220 may function as a multi-bridge channel or a nanowire channel connecting the source/drain patterns SD. Each of the first transistor 10 and the second transistor 20 may constitute a multi bridge channel FET (MBCFET). Each of the source/drain patterns SD may physically contact the second semiconductor patterns 220. The source/drain patterns SD may be spaced apart from each other in the first direction D1 with the second semiconductor patterns 220 therebetween. The source/drain patterns SD may be electrically connected to each other through the second semiconductor patterns 220. The second semiconductor patterns 220 and the source/drain patterns SD may constitute an active structure on the base active pattern 110. The active structure and the gate pattern 700 may constitute a gate-all-around field effect transistor.

The first transistor 10 may be on the first region R1 of the substrate 100. The first transistor 10 may include a first base active pattern 111, a first active pattern 201, source/drain patterns SD on the first base active pattern 111, a first gate insulating film 610, and a first portion of a gate pattern 700. The first gate insulating film 610 may be between the first base active pattern 111 and the gate pattern 700, and between the first active pattern 201 and the gate pattern 700.

The second transistor 20 may be on the second region R2 of the substrate 100, and may include a second base active pattern 112, a second active pattern 202, and source/drain patterns SD on the second base active pattern 112, a second gate insulating film 612, and a second portion of the gate pattern 700 on the second gate insulating film 612. The second gate insulating film 612 may be between the second base active pattern 112 and the gate pattern 700, and between the second active pattern 202 and the gate pattern 700. The second gate insulating film 612 may further include the second metal (e.g., not included in the first gate insulating film 610), and the second transistor 20 may have threshold voltage characteristics different from that of the first transistor 10. The second portion of the gate pattern 700 may be connected to the first portion of the gate pattern 700. The first transistor 10 and the second transistor 20 may share the gate pattern 700.

In an implementation, an upper insulating film may be formed on the interlayer insulating film 400. First contact plugs that penetrate the upper insulating film and the interlayer insulating film 400 to be electrically connected to the source/drain patterns SD, and a second contact plug that penetrates the upper insulating film to be electrically connected to the gate pattern 700 may be formed. Wirings connecting to the first and second contact plugs may be formed on the upper insulating film. The first and second contact plugs and wirings may be formed of conductive materials. Manufacturing a semiconductor device may be completed by the manufacturing examples described above.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, an etching composition film and a metal-containing film using the same, and etching of a metal oxide film will be described.

Preparation of Etching Composition

Experimental Examples

As shown in Table 1 below, an oxidizing agent, a pH adjusting agent, and a chelating agent were mixed to prepare an etching composition. In this case, hydrogen peroxide was used as an oxidizing agent, and ammonium acetate was used as a pH adjusting agent. As a chelating agent, ethylenediaminetetraacetic acid (hereinafter referred to as EDTA), diethylenetriamine pentaacetic acid (hereinafter referred to as DTPA), ethylenediamine tetra(methylene phosphonic acid) (hereinafter referred to as EDTMP), or iminodiacetic acid were used. The remainder of the composition corresponds to water.

TABLE 1

| | Composition (wt %) | | | |
|---|---|---|---|---|
| | Hydrogen peroxide | Ammonium acetate | Chelating agent | pH |
| Experimental Example 1 | 25 | 10 | EDTA | 1 | 4.0-5.8 |
| Experimental Example 2 | 10 | 1 | EDTA | 0.1 | 4.0-5.8 |
| Experimental Example 3 | 25 | 10 | DTPA | 1 | 4.0-5.8 |
| Experimental Example 4 | 10 | 1 | DTPA | 0.1 | 4.0-5.8 |
| Experimental Example 5 | 25 | 10 | EDTMP | 1 | 4.0-5.8 |
| Experimental Example 6 | 10 | 1 | EDTMP | 0.1 | 4.0-5.8 |
| Experimental Example 7 | 25 | 10 | Iminodiacetic acid | 1 | 4.0-5.8 |
| Experimental Example 8 | 10 | 1 | Iminodiacetic acid | 0.1 | 4.0-5.8 |

TABLE 1-continued

| | Composition (wt %) | | | |
|---|---|---|---|---|
| | Hydrogen peroxide | Ammonium acetate | Chelating agent | pH |
| Experimental Example 9 | 20 | 5 | Iminodiacetic acid 1.0 | 4.7 |

Comparative Examples

As shown in Table 2 below, an oxidizing agent and a pH adjusting agent were mixed to prepare an etching composition. In this case, hydrogen peroxide was used as an oxidizing agent. In Comparative Examples 6, 7, 8, 10, 11, 12, and 13, iminodiacetic acid was further added to the etching composition. The remainder of the composition corresponds to water.

TABLE 2

| | Composition (wt %) | | | |
|---|---|---|---|---|
| | Hydrogen peroxide | pH adjusting agent | Iminodiacetic acid | pH |
| Comparative Example 1 | 5 | — | — | — |
| Comparative Example 2 | 20 | — | — | — |
| Comparative Example 3 | 31 | — | — | — |
| Comparative Example 4 | 25 | NH$_4$OH 1 | — | 7 or more |
| Comparative Example 5 | 20 | HF 0.5 | — | — |
| Comparative Example 6 | 20 | Ammonium acetate 5 | 0.1 | 6.4 |
| Comparative Example 7 | 20 | Ammonium acetate 5 | 4.0 | 3.0 |
| Comparative Example 8 | 20 | — | 0.4 | 3.7 |
| Comparative Example 9 | 20 | Ammonium acetate 0.5 | — | 6.0 |
| Comparative Example 10 | 4.0 | Ammonium acetate 1.0 | 0.4 | 4.6 |
| Comparative Example 11 | 20 | Ammonium acetate 20.0 | 3.0 | 4.7 |
| Comparative Example 12 | 20 | Ammonium acetate 5.0 | 0.05 | 5.8 |
| Comparative Example 13 | 20 | Ammonium acetate 5.0 | 6.0 | 3.0 |

Etching Using Etching Composition (1) Etching of Titanium Nitride Film

A titanium nitride film (TiN) having a thickness of 180 Å was formed on a substrate. The etching composition was placed in a beaker, and the beaker was heated until the temperature of the etching composition reached 70° C. The etching composition at 70° C. was applied to the titanium nitride film to measure an etching rate. In this case, etching of the titanium nitride film was performed using each of the etching compositions of Experimental Examples 1 to 9 and Comparative Examples 1 to 13. The etching rate was measured using a thin film thickness measuring apparatus, and an ellipsometer (M-2000, J. A. Woolam) was used as the thin film thickness measuring apparatus. In Example 6, the etching rate was measured using an etching composition at 60° C. In Comparative Example 5, the etching rate was measured using an etching composition at 50° C.

(2) Etching of Lanthanum Oxide Film

A lanthanum oxide film (La$_2$O$_3$) having a thickness of 85 Å was formed on a substrate. Etching of the lanthanum oxide film was performed using each of etching compositions of Experimental Examples 1 to 9 and Comparative Examples 1 to 13 in the same manner as described for etching the titanium nitride film. The etching rate of the lanthanum oxide film was measured.

(3) Etching of Aluminum Oxide Film

An aluminum oxide film (Al$_2$O$_3$) having a thickness of 106 Å was formed on a substrate. Etching of the aluminum oxide film was performed using each of the etching compositions of Experimental Examples 1 to 9 and Comparative Examples 1 to 13 in the same manner as described for etching the titanium nitride film. The etching rate of the aluminum oxide film was measured.

(4) Etching of Hafnium Oxide Film

A hafnium oxide film (HfO$_2$) was formed on a substrate. Etching of the hafnium oxide film was performed using each of etching compositions of Experimental Examples 1 to 9 and Comparative Examples 1 to 13 in the same manner as described for etching the titanium nitride film. The etching rate of the hafnium oxide film was measured.

Table 3 shows results of measuring the etching rates of the titanium nitride film, the lanthanum oxide film, the aluminum oxide film, and the hafnium oxide film using the etching compositions of the Experimental Examples and the Comparative Examples.

TABLE 3

| | etching rate of film (Å/min) | | | |
|---|---|---|---|---|
| | titanium nitride film | lanthanum oxide film | aluminum oxide film | hafnium oxide film |
| Experimental Example 1 | 292.2 | 27.1 | Less than 0.1 | Less than 0.1 |
| Experimental Example 2 | 134.2 | 19.1 | Less than 0.1 | Less than 0.1 |
| Experimental Example 3 | 304.8 | Less than 0.1 | Less than 0.1 | Less than 0.1 |
| Experimental Example 4 | 140.8 | Less than 0.1 | Less than 0.1 | Less than 0.1 |
| Experimental Example 5 | 294.6 | 17.3 | Less than 0.1 | Less than 0.1 |
| Experimental Example 6 | 102.2 | 6.0 | Less than 0.1 | Less than 0.1 |
| Experimental Example 7 | 299.4 | 1.2 | Less than 0.1 | Less than 0.1 |
| Experimental Example 8 | 103.6 | Less than 0.1 | Less than 0.1 | Less than 0.1 |
| Experimental Example 9 | 211.7 | Less than 0.1 | Less than 0.1 | Less than 0.1 |
| Comparative Example 1 | 43.2 | 4.1 | 1.3 | Less than 0.1 |
| Comparative Example 2 | 155.2 | 7.4 | 1.1 | Less than 0.1 |
| Comparative Example 3 | 187.8 | 9.1 | 1.3 | Less than 0.1 |
| Comparative Example 4 | 364.2 | Less than 0.1 | 84.6 | 4.2 |
| Comparative Example 5 | 300.8 | 220.1 | 134.1 | 7.1 |
| Comparative Example 6 | 330.8 | Less than 0.1 | 3.2 | Less than 0.1 |
| Comparative Example 7 | 80.4 | 11.6 | 13.7 | Less than 0.1 |
| Comparative Example 8 | 30.2 | 74.4 | 0.0 | — |
| Comparative Example 9 | 401.3 | 0.0 | 21.6 | — |
| Comparative Example 10 | 1.3 | 20.1 | 0.0 | — |

TABLE 3-continued

| | etching rate of film (Å/min) | | | |
|---|---|---|---|---|
| | titanium nitride film | lanthanum oxide film | aluminum oxide film | hafnium oxide film |
| Comparative Example 11 | 207.3 | 60.3 | 0.0 | — |
| Comparative Example 12 | 378.1 | 0.0 | 16.7 | |
| Comparative Example 13 | 15.7 | 78.9 | 2.3 | |

Referring to Table 3, in the case of the etching process using the etching compositions of Experimental Examples 1 to 9, the etching rate of the titanium nitride film was much higher than the etching rates of the lanthanum oxide film, aluminum oxide film, and hafnium oxide film. In the case of the etching process using the etching compositions of Experimental Examples 1 to 9, the etch selectivity of the etching composition relative to the titanium nitride film was relatively higher. The titanium nitride film may correspond to an etching target film. Comparative Example 1 included less than 5% of hydrogen peroxide, and the etching rate of the titanium nitride film was low. Comparative Example 3 included more than 30% of hydrogen peroxide, and had a relatively higher etching rate with respect to lanthanum oxide and aluminum oxide.

The etching compositions of Comparative Examples 1, 2, and 3 did not include a pH adjusting agent and a chelating agent. In Comparative Examples 1 to 3, the etch selectivity of the titanium nitride film with respect to the lanthanum oxide film and the etch selectivity of the titanium nitride film with respect to the aluminum oxide film were lower than those of the etching compositions of Experimental Examples 1 to 9.

The etching composition of Comparative Example 4 had a pH of 7 or higher. In the etching process using the etching composition of Comparative Example 4, the etching rate of the aluminum oxide film and the etching rate of the hafnium oxide film were excessively high.

The etching composition of Comparative Example 5 included a fluorine-containing material (HF), and the etching rate of the lanthanum oxide film, the etching rate of the aluminum oxide film, and the etching rate of the hafnium oxide film were excessively high. The etching of the aluminum oxide film and the hafnium oxide film may correspond to unwanted film etching.

The etching composition of Comparative Example 6 had a pH of greater than 5.8. In the etching process using the etching composition of Comparative Example 6, the etching rate of the aluminum oxide film was high.

The etching composition of Comparative Example 7 had a pH of less than 4.0. In the etching process using the etching composition of Comparative Example 7, the etching rate of the titanium nitride film was low.

The etching composition of Comparative Example 8 did not include a pH adjusting agent, and had a pH of less than 4.0. In the etching process using the etching composition of Comparative Example 8, the etching rate of the titanium nitride film was low.

The etching composition of Comparative Example 9 included less than 5 wt % of a pH adjusting agent, and had a pH of greater than 5.8. In the etching process using the etching composition of Comparative Example 9, the etching rate of the aluminum oxide film was excessively high.

The etching composition of Comparative Example 10 included less than 5 wt % of an oxidizing agent. In the etching process using the etching composition of Comparative Example 10, the etching rate of the titanium nitride film was low.

The etching composition of Comparative Example 11 included greater than 15 wt % of a pH adjusting agent. In the etching process using the etching composition of Comparative Example 11, the etching rate of the lanthanum oxide film was excessively high.

The etching composition of Comparative Example 12 included less than 0.1 wt % of a chelating agent. In the etching composition using the etching composition of Comparative Example 12, the etching rate of the aluminum oxide film was excessively high. The etching of the aluminum oxide film may correspond to unwanted film etching.

The etching composition of Comparative Example 13 included greater than 5 wt % of a chelating agent, and had a pH of less than 4. In the etching process using the etching composition of Comparative Example 13, the etching rate of the titanium nitride film was low and the etching rate of the aluminum oxide film was excessively high. For example, the etching rate of the titanium nitride film in the etching process was lower than the etching rate of the lanthanum oxide film.

By way of summation and review, as the integration level of semiconductor devices gets higher, damage to components of the semiconductor devices in the manufacturing process of the semiconductor devices may have a greater impact on reliability and electrical characteristics of semiconductor memory devices. In the manufacturing process of semiconductor devices, a high etch selectivity between an etching target film and another film should be maintained.

According to an embodiment, an etching process using an etching composition may have a high etch selectivity of or with respect to different metal-containing films. A semiconductor device manufactured using the etching composition may exhibit improved electrical characteristics.

One or more embodiments may provide an etching composition used for etching a metal-containing film.

One or more embodiments may provide an etching composition having a high etch selectivity with respect to a metal-containing film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An etching composition, comprising:
   5 wt % to 30 wt % of an oxidizing agent, based on a total weight of the etching composition;
   a salt including:
      an anion including a carboxylate moiety having 1 to 5 carbon atoms, and
      an ammonium cation; and
   a chelating agent including a phosphonic acid having 1 to 8 carbon atoms, wherein the etching composition has a pH of 4.0 to less than 5.5.

2. The etching composition as claimed in claim 1, wherein the salt is included in the etching composition in an amount of 1 wt % to 15 wt %, based on the total weight of the etching composition.

3. The etching composition as claimed in claim 1, wherein the chelating agent is included in the etching composition in an amount of 0.1 wt % to 5 wt %, based on the total weight of the etching composition.

4. The etching composition as claimed in claim 1, wherein the salt includes ammonium acetate.

5. The etching composition as claimed in claim 1, wherein the chelating agent includes phenylphosphonic acid, nitrilotris(methylene) tris-phosphonic acid, ethylenediaminetetraphosphonic acid, or 1-hydroxyethane-1,1-diphosphonic acid.

6. A method of manufacturing a semiconductor device, the method comprising:
preparing a substrate that includes a metal-containing film thereon; and
performing an etching process using the etching composition according to claim 1 on the metal-containing film to remove the metal-containing film.

7. The method as claimed in claim 6, further comprising:
forming an active pattern on the substrate;
forming a first gate insulating film including a first metal on the active pattern;
forming a metal oxide film including a second metal on the first gate insulating film;
forming the metal-containing film on the metal oxide film, the metal-containing film including the second metal and a third metal different from the second metal; and
forming a mask film on the metal-containing film,
wherein, during the etching process, the metal-containing film has an etch selectivity with respect to the mask film.

8. The method as claimed in claim 7, wherein:
the metal oxide film includes lanthanum or aluminum; and
the metal-containing film includes a titanium nitride film that further includes lanthanum or aluminum.

9. The method as claimed in claim 7, wherein:
the metal-containing film includes:
a first portion on a first region of the substrate and exposed by the mask film; and
a second portion on a second region of the substrate and covered with the mask film, the second region of the substrate being spaced apart from the first region,
performing the etching process includes removing the first portion of the metal-containing film, and
after the etching process, the second portion of the metal-containing film remains.

10. The method as claimed in claim 9, further comprising performing an annealing process on the first gate insulating film and the metal oxide film to form a second gate insulating film after the etching process,
wherein the second gate insulating film is on the second region of the substrate, and includes the first metal and the second metal.

11. An etching composition, comprising:
5 wt % to 30 wt % of an oxidizing agent;
1 wt % to 15 wt % of a pH adjusting agent containing an ammonium salt; and
0.1 wt % to 5 wt % of a chelating agent, all wt % being based on a total weight of the etching composition,
wherein the etching composition has a pH of 4.0 to less than 5.5.

12. The etching composition as claimed in claim 11, wherein:
the oxidizing agent includes hydrogen peroxide, nitric acid, or ammonium sulfate,
the pH adjusting agent includes ammonium phosphate monobasic, ammonium phosphate dibasic, ammonium triphosphate, ammonium acetate, ammonium halide, or ammonium nitrate, and
the chelating agent includes nitrilotris(methylene) tris-phosphonic acid, ethylenediaminetetra phosphonic acid, 1-hydroxyethane-1,1-diphosphonic acid, ethylenediaminetetraacetic acid, iminodiacetic acid, diethylenetriaminepentaacetic acid, glycine, alanine, valine, leucine, tyrosine, sulfamic acid, or cysteine.

13. The etching composition as claimed in claim 11, wherein the ammonium salt includes an anion including a carboxylate moiety having 1 to 5 carbon atoms.

14. The etching composition as claimed in claim 11, wherein the chelating agent includes a phosphonic acid having 1 to 8 carbon atoms or a conjugate base thereof.

15. The etching composition as claimed in claim 14, wherein the chelating agent comprises phenylphosphonic acid, nitrilotris(methylene) tris-phosphonic acid, ethylenediaminetetra phosphonic acid, 1-hydroxyethane-1,1-diphosphonic acid, or a conjugate base thereof.

16. A method of manufacturing a semiconductor device, the method comprising:
preparing a substrate that includes a metal-containing film thereon; and
performing an etching process using the etching composition according to claim 11, on the metal-containing film to remove the metal-containing film.

17. The method as claimed in claim 16, wherein;
the metal-containing film includes a titanium nitride film; and
the titanium nitride film further includes lanthanum or aluminum.

18. The method as claimed in claim 16, further comprising forming a mask film on the metal-containing film,
wherein, during the etching process, the metal-containing film has an etch selectivity with respect to the mask film.

19. An etching composition, consisting essentially of:
5 wt % to 30 wt % of an oxidizing agent;
1 wt % to 15 wt % of a pH adjusting agent;
0.1 wt % to 5 wt % of a chelating agent, all wt % being based on a total weight of the etching composition; and
water,
wherein:
the etching composition has a pH of 4.0 to less than 5.5,
the oxidizing agent includes hydrogen peroxide, nitric acid, or ammonium sulfate,
the pH adjusting agent includes ammonium phosphate monobasic, ammonium phosphate dibasic, ammonium triphosphate, ammonium acetate, ammonium halide, or ammonium nitrate, and
the chelating agent includes nitrilotris(methylene) tris-phosphonic acid, ethylenediaminetetra phosphonic acid, 1-hydroxyethane-1,1-diphosphonic acid, ethylenediaminetetraacetic acid, iminodiacetic acid, diethylenetriaminepentaacetic acid, glycine, alanine, valine, leucine, tyrosine, sulfamic acid, or cysteine.

20. The etching composition as claimed in claim 19, wherein the composition consists of:
10 wt % to 25 wt % of hydrogen peroxide;
1 wt % to 10 wt % of ammonium acetate;

0.1 wt % to 1 wt % of ethylenediaminetetraacetic acid, diethylenetriamine pentaacetic acid, ethylenediamine tetra(methylene phosphonic acid), or iminodiacetic acid, all wt % being based on a total weight of the etching composition; and
water.

* * * * *